(12) United States Patent
Kwack et al.

(10) Patent No.: US 11,495,653 B2
(45) Date of Patent: Nov. 8, 2022

(54) ORGANIC LIGHT EMITTING DISPLAY DEVICE

(71) Applicant: LG Display Co., Ltd., Seoul (KR)

(72) Inventors: Hee-Young Kwack, Paju-si (KR); Oh-Young Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 219 days.

(21) Appl. No.: 16/924,014

(22) Filed: Jul. 8, 2020

(65) Prior Publication Data

US 2021/0020721 A1  Jan. 21, 2021

(30) Foreign Application Priority Data

Jul. 15, 2019 (KR) .................. 10-2019-0085366

(51) Int. Cl.
*H01L 27/32* (2006.01)

(52) U.S. Cl.
CPC ...... *H01L 27/3272* (2013.01); *H01L 27/3246* (2013.01)

(58) Field of Classification Search
CPC .................. H01L 27/3272; H01L 27/3246

USPC ........................................................ 257/40
See application file for complete search history.

(56) References Cited

U.S. PATENT DOCUMENTS

2017/0288010 A1* 10/2017 Han .................... H01L 27/3279

FOREIGN PATENT DOCUMENTS

KR   10-2016-0012876 A    2/2016

* cited by examiner

*Primary Examiner* — Dzung Tran
(74) *Attorney, Agent, or Firm* — Birch, Stewart, Kolasch & Birch, LLP

(57) ABSTRACT

An organic light emitting display device includes a substrate having a sub-pixel area and a pad area, a light shielding layer in the sub-pixel area, a thin film transistor on the light shielding layer in the sub-pixel area, a light emitting diode connected to the thin film transistor, a lower pad electrode in the pad area, a first insulating layer covering the lower pad electrode to expose a portion of the lower pad electrode, an upper pad electrode connected to the lower pad electrode, and a second insulating layer between the first insulating layer and the upper pad electrode, the second insulating layer overlapping the upper pad electrode so that an end portion of the second insulating layer coincides with an end portion of the upper pad electrode.

20 Claims, 18 Drawing Sheets

ORGANIC LIGHT EMITTING DISPLAY DEVICE

CROSS REFERENCE TO RELATED APPLICATIONS

The present application claims the priority benefit of Korean Patent Application No. 10-2019-0085366 filed in Republic of Korea on Jul. 15, 2019, the entire contents of which are hereby expressly incorporated by reference in its entirety for all purposes as if fully set forth herein into the present application.

BACKGROUND

Technical Field

The present disclosure relates to an organic light emitting display device, and more particularly, to an organic light emitting display where a number of photomasks is reduced and deterioration of a pad area is prevented.

Discussion of the Related Art

As an information-oriented society progresses, demand for a display device displaying an image have increased with various forms. In a display device field, a cathode ray tube (CRT) having a relatively large volume has been rapidly replaced by a flat panel display (FPD) device having a thin profile, a light weight and applicable to a relatively large size. The FPD device includes a liquid crystal display (LCD) device, a plasma display panel (PDP) and an organic light emitting display (OLED) device and an electrophoretic display (ED) device.

Among the FPD devices, the OLED device is an emissive device and has advantages such as a high response speed, a high luminance and a wide viewing angle. Specifically, the OLED device can be formed on a flexible substrate. In addition, the OLED device can be driven with a relatively low voltage and can have advantages such as a small power consumption and an excellent color sensitivity as compared with the PDP or an inorganic electroluminescent (EL) display.

The OLED device can include a plurality of thin film transistors and an organic light emitting diode emitting a light. The thin film transistors and the organic light emitting diode can be fabricated through a photolithographic process using a plurality of photomasks.

Since the plurality of photomasks are used for fabricating the thin film transistors and the organic light emitting diode, productivity can be reduced and fabrication cost can increase. In addition, a pad area of the OLED device can be deteriorated during the photolithographic process.

SUMMARY

Accordingly, the present disclosure is directed to an organic light emitting display device that substantially obviates one or more of the problems due to limitations and disadvantages of the related art.

An object of the present disclosure is to provide a display device and a method of fabricating the display device where a fabrication process is simplified by reducing a number of a plurality of photomasks and deterioration of a pad area is prevented.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting display device includes a substrate having a sub-pixel area and a pad area; a light shielding layer on the substrate in the sub-pixel area; a thin film transistor on the light shielding layer in the sub-pixel area; a light emitting diode in the sub-pixel area and connected to the thin film transistor; a lower pad electrode in the pad area; a first insulating layer covering the lower pad electrode to expose a portion of the lower pad electrode; an upper pad electrode on the first insulating layer and connected to the lower pad electrode; and a second insulating layer between the first insulating layer and the upper pad electrode, the second insulating layer overlapping the upper pad electrode so that an end portion of the second insulating layer coincides with an end portion of the upper pad electrode.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Figure 1:
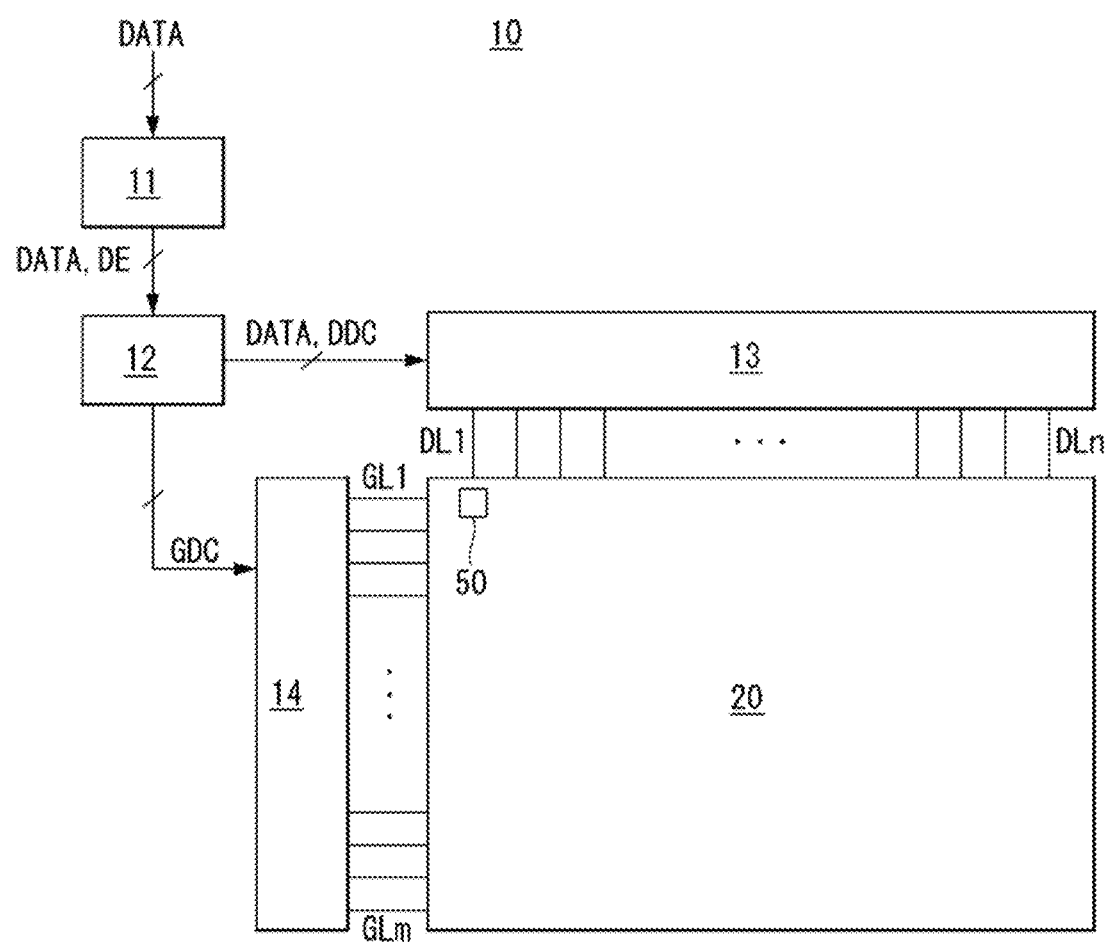
FIG. 1 is a view showing an organic light emitting display device according to a first embodiment of the present disclosure.

Advantages and features of the present disclosure, and implementation methods thereof will be clarified through following example embodiments described with reference to the accompanying drawings. The present disclosure can, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration can be omitted. In a case where terms "comprise," "have," and "include" described in the present specification are used, another part can be added unless a more limiting term, such as "only," is used. The terms of a singular form can include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts can be disposed between the two parts unless a more limiting term, such as "just" or "direct(ly)," is used.

It will be understood that, although the terms "first," "second," etc. can be used herein to describe various elements, these elements should not be limited by these terms and may not define any order. These terms are only used to distinguish one element from another. For example, a first element could be termed a second element, and, similarly, a second element could be termed a first element, without departing from the scope of the present disclosure.

Features of various embodiments of the present disclosure can be partially or overall coupled to or combined with each other, and can be variously inter-operated with each other and driven technically as those skilled in the art can sufficiently understand. Embodiments of the present disclosure can be carried out independently from each other, or can be carried out together in co-dependent relationship.

Hereinafter, an organic light emitting display device according to embodiments of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

Although an organic light emitting display (OLED) device, a liquid crystal display (LCD) device and an electrophoretic display (ED) device can be used as a display device according to the present disclosure, an OLED device will be exemplarily illustrated in the present disclosure. The OLED device includes a first electrode of an anode, a second electrode of a cathode and an organic emitting layer of an organic material between the first and second electrode. As a result, in the OLED device of an emissive device, a hole supplied from the first electrode and an electron supplied from the second electrode are combined with each other in an organic emitting layer to generate an exciton of a pair of hole-electron, and a light is emitted due to an energy generated when the exciton transitions from an excited state to a ground state.

Figure 2:
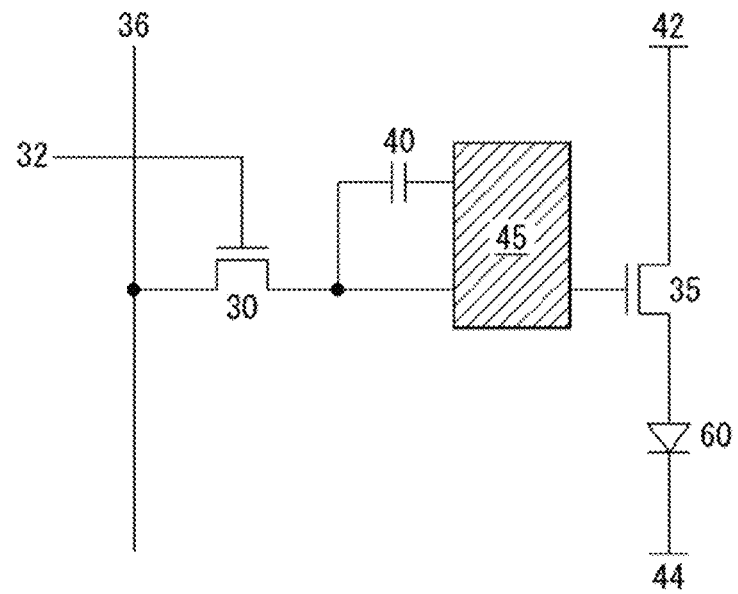
FIG. 2 is a view showing a sub-pixel of the organic light emitting display device according to the first embodiment of the present disclosure.
Figure 3:
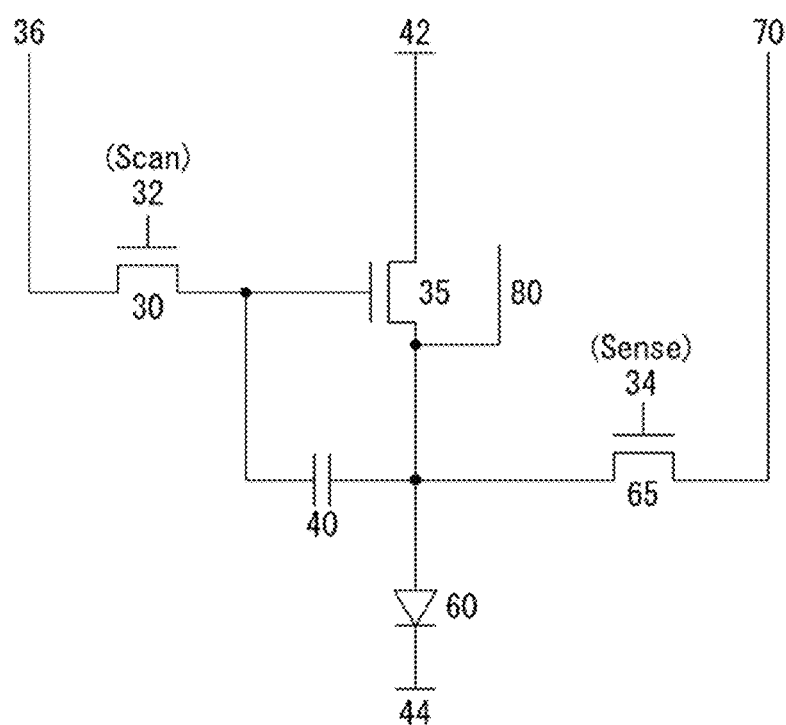
FIG. 3 is a view showing a detailed circuit of the sub-pixel of the organic light emitting display device according to the first embodiment of the present disclosure.

FIG. 1 is a view showing an organic light emitting display device according to a first embodiment of the present disclosure, FIG. 2 is a view showing a sub-pixel of the organic light emitting display device according to the first embodiment of the present disclosure, and FIG. 3 is a view showing a detailed circuit of the sub-pixel of the organic light emitting display device according to the first embodiment of the present disclosure. All the components of the organic light emitting display device according to all embodiments of the present disclosure are operatively coupled and configured.

In FIG. 1, an organic light emitting display (OLED) device 10 includes an image processing part 11, a timing controlling part 12, a data driving part 13, a gate driving part 14 and a display panel 20.

The image processing part 11 outputs a data signal DATA supplied from an exterior and a data enable signal DE. Although the image processing part 11 can output at least one of a vertical synchronization signal, a horizontal synchronization signal and a clock signal as well as the data enable signal DE, the above signals can be omitted for convenience of illustration.

The timing controlling part 12 receives a plurality of driving signals including the data enable signal DE, the vertical synchronization signal, the horizontal synchronization signal and the clock signal and the data signal DATA from the image processing part 11. The timing controlling part 12 outputs a gate control signal GDC for controlling a driving timing of the gate driving part 14 and a data control signal DDC for controlling a driving timing of the data driving part 13 based on the plurality of driving signals.

The data driving part 13 samples and latches the data signal DATA supplied from the timing controlling part 12 in response to the data control signal DDC supplied from the timing controlling part 12. The data driving part 13 converts the data signal DATA into a gamma reference voltage and outputs the gamma reference voltage. The data driving part 13 outputs the data signal DATA through a plurality of data lines DL1 to DLn. The data driving part 13 can be formed as an integrated circuit (IC).

The gate driving part 14 outputs a gate signal in response to the gate control signal GDC supplied from the timing controlling part 12. The gate driving part 14 outputs the gate signal through a plurality of gate lines GL1 to GLm. The gate driving part 14 can be formed as an integrated circuit (IC) or can be formed in the display panel 20 as a gate in panel (GIP).

The display panel 20 displays an image in response to the data signal DATA supplied from the data driving part 13 and the gate signal supplied from the gate driving part 14. The display panel 20 includes a plurality of sub-pixels 50 driven to display the image.

The plurality of sub-pixels 50 can include a red sub-pixel, a green sub-pixel and a blue sub-pixel or can include a white sub-pixel, a red sub-pixel, a green sub-pixel and a blue sub-pixel. The plurality of sub-pixels 50 can have at least one different emitting area according to an emission property.

In FIG. 2, one sub-pixel includes a switching transistor 30, a driving transistor 35, a capacitor 40, a compensating circuit 45 and a light emitting diode 60.

The switching transistor 30 is turned on and off (switching) in response to the gate signal supplied from a first gate line 32 such that the data signal supplied through a first data line 36 is stored as a data voltage in the capacitor 40. The driving transistor 35 is turned on and off according to the data voltage stored in the capacitor 40 such that a driving current flows between a first source line 42 of a high level voltage and a second source line 44 of a low level voltage. The light emitting diode 60 is driven to emit a light according to the driving current formed by the driving transistor 35.

The compensating circuit 45 is added in the sub-pixel to compensate a threshold voltage of the driving transistor 35. The compensating circuit 45 can include at least one transistor. The compensating circuit 45 can have various structures according to an external compensating method. The compensating circuit 45 will be exemplarily illustrated hereinafter.

In FIG. 3, the compensating circuit 45 can include a sensing transistor 65 and a sensing line 70 (or a reference line). The sensing transistor 65 is connected between a source electrode of the driving transistor 35 and an anode (hereinafter, a sensing node) of the light emitting diode 60. The sensing transistor 65 supplies an initializing voltage (or a sensing voltage) transmitted through the sensing line 70 to the sensing node of the driving transistor 35, or the sensing transistor 65 senses a voltage or a current of the sensing node of the driving transistor 35 or the sensing line 70.

A first electrode of the switching transistor 30 is connected to the first data line 36, and a second electrode of the switching transistor 30 is connected to the gate electrode of the driving transistor 35. A first electrode of the driving transistor 35 is connected to the first source line 42, and a second electrode of the driving transistor 35 is connected to the anode of the light emitting diode 60. A first electrode of the capacitor 40 is connected to the gate electrode of the driving transistor 35, and a second electrode of the capacitor 40 is connected to the anode of the light emitting diode 60. The anode of the light emitting diode 60 is connected to the second electrode of the driving transistor 35, and the cathode of the light emitting diode 60 is connected to the second source line 44. A first electrode of the sensing transistor 65 is connected to the sensing line 70, and a second electrode of the sensing transistor 65 is connected to the anode of the light emitting diode 60 of the sensing node and the second electrode of the driving transistor 35.

An operation timing of the sensing transistor 65 can be similar to or the same as that of the switching transistor 30 according to an external compensating algorithm (or a structure of the compensating circuit). For example, the gate electrode of the switching transistor 30 can be connected to the first gate line 32, and the gate electrode of the sensing transistor 65 can be connected to a second gate line 34. In this case, the gate signal Scan can be transmitted to the first gate line 32, and a sensing signal Sense can be transmitted to the second gate line 34. In another embodiment, the first gate line 32 connected to the gate electrode of the switching transistor 30 and the second gate line 34 connected to the gate electrode of the sensing transistor 65 can be commonly connected to each other.

The sensing line 70 can be connected to the data driving part. In this case, the data driving part senses the sensing node of the sub-pixel in a real time or during a non-display period or during an Nth frame (N is an integer equal to or greater than 1) and generates a sensing result. The switching transistor 30 and the sensing transistor 65 can be turned on at the same time. In this case, a sensing operation through the sensing line 70 based on a time division method of the data driving part and a data outputting operation outputting the data signal are separated (divided) from each other.

A compensation object according to the sensing result can include the data signal of a digital type, the data signal of an analog type and the gamma. The compensating circuit generating a compensation signal (or a compensation voltage) based on the sensing result can be disposed inside the data driving part or the timing controlling part, or can be formed as an additional circuit.

A light shielding layer can be disposed only under a channel region of the driving transistor 35, or can be disposed under channel regions of the switching transistor 30 and the sensing transistor 65 as well as a channel region of the driving transistor 35. The light shielding layer can be used for blocking an external light or can be used as an electrode connected to another electrode or another line and constituting a capacitor. As a result, the light shielding layer can be formed of a plurality of metal layers (of different kinds of metals) to have a light shielding property.

Although the sub-pixel exemplarily has a 3T1C (3 transistors and 1 capacitor) structure including the switching transistor 30, the driving transistor 35, the capacitor 40, the light emitting diode 60 and the sensing transistor 65 in FIG. 3, the sub-pixel can have one of 3T2C, 4T2C, 5T1C and 6T2C structures including the compensating circuit 45 in another embodiment.

Figure 4:
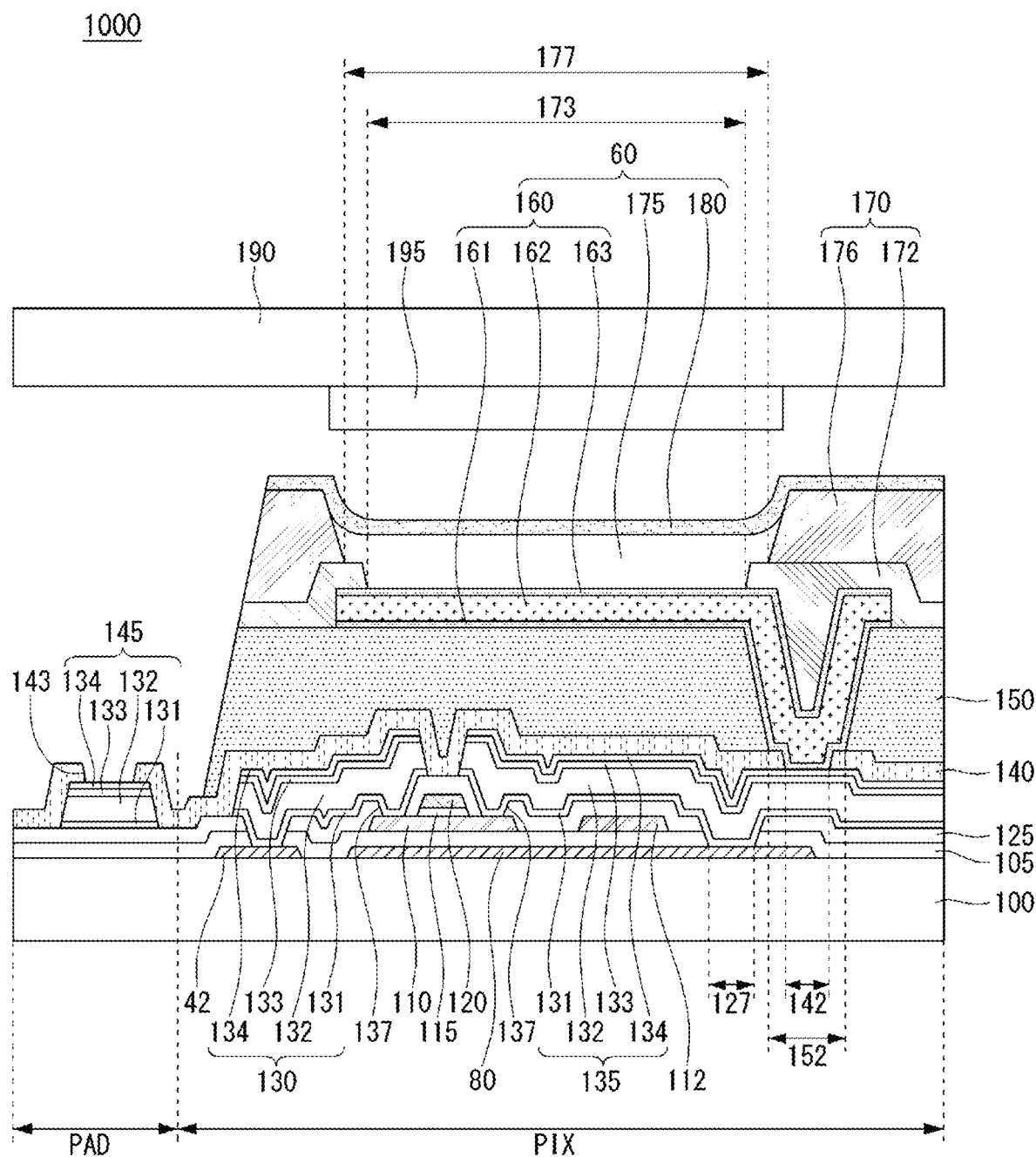
FIG. 4 is a cross-sectional view showing the sub-pixel of the organic light emitting display device according to the first embodiment of the present disclosure.

FIG. 4 is a cross-sectional view showing the sub-pixel of the organic light emitting display device according to the first embodiment of the present disclosure.

In FIG. 4, the organic light emitting display (OLED) device 1000 according to the first embodiment of the present disclosure includes a substrate 100 having a sub-pixel area PIX and a pad area PAD. The sub-pixel area PIX corresponds to a display region where an image is displayed by emitting a light, and the pad area PAD corresponds to a region where signals for driving a sub-pixel from an exterior are applied. A light shielding layer 80 and a first source line 42 are disposed on the substrate 100. The light shielding layer 80 blocks an external light to prevent a photo current from generating in a transistor. The first source line 42 is spaced apart from the light shielding layer 80. The light shielding layer 80 and the first source line 42 are formed through the same fabrication process to have the same material and the same lamination structure as each other. A buffer layer 105 is disposed on the light shielding layer 80 and the first source line 42. The buffer layer 105 protects a transistor formed in a subsequent fabrication process from an impurity such as an alkali ion released from the substrate 100 and electrically insulates the light shielding layer 80 and the first source line 42. The buffer layer 105 can include silicon oxide (SiOx), silicon nitride (SiNx) or a multiple layer thereof.

A semiconductor layer 110 is disposed on the buffer layer 105. The semiconductor layer 110 can include a silicon semiconductor material, an oxide semiconductor material or an organic semiconductor material. The silicon semiconductor material can include amorphous silicon or polycrystalline silicon formed by crystallizing amorphous silicon. The oxide semiconductor material can include one of zinc oxide (ZnO), indium zinc oxide (InZnO), indium gallium zinc oxide (InGaZnO) and zinc tin oxide (ZnSnO). The organic semiconductor material can include a low molecular (oligomeric) organic material or a high molecular (polymeric) organic material such as mellocyanine, phthalocyanine, pentacene and thiophen polymer. The semiconductor layer 110 includes a drain region and a source region having an impurity of a p-type or an n-type and a channel region therebetween. A first capacitor electrode 112 is disposed to be spaced apart from the semiconductor layer 110. The semiconductor layer 110 and the first capacitor electrode 112 are formed through the same fabrication process to have the same material and the same lamination structure as each other.

A gate insulating layer 115 is disposed on the semiconductor layer 110. The gate insulating layer 115 can include silicon oxide (SiOx), silicon nitride (SiNx) or a multiple layer thereof. A gate electrode 120 is disposed on the gate insulating layer 115 corresponding to a region of the semiconductor layer, i.e., the channel region when the impurity is injected. The gate electrode 120 can include one or an alloy of ones selected from a group of molybdenum (Mo), aluminum (Al), chromium (Cr), gold (Au), titanium (Ti), nickel (Ni), neodymium (Nd) and copper (Cu). In addition, the gate electrode 120 can include a multiple layer including one or an alloy of ones selected from a group of molybdenum (Mo), aluminum (Al), chromium (Cr), gold (Au), titanium (Ti), nickel (Ni), neodymium (Nd) and copper (Cu). For example, the gate electrode 120 can include a double layer of molybdenum/aluminum-neodymium (Mo/AlNd) or molybdenum/aluminum (Mo/Al).

An interlayer insulating layer 125 is disposed on the substrate 100 having the gate electrode 120 to electrically insulate the gate electrode 120. The interlayer insulating layer 125 can include silicon oxide (SiOx), silicon nitride (SiNx) or a multiple layer thereof.

A source electrode 130 and a drain electrode 135 are disposed on the interlayer insulating layer 125 in the sub-pixel area PIX, and a pad electrode 145 is disposed on the interlayer insulating layer 125 in the pad area PAD. The interlayer insulating layer 125 has two first contact holes 137 exposing the source region and the drain region of the semiconductor layer 110, and the source electrode 130 and the drain electrode 135 are connected to the semiconductor layer 110 through the two first contact holes 137. In addition, the interlayer insulating layer 125 and the buffer layer 105 can have a second contact hole 127 exposing the light shielding layer 80, and the drain electrode 135 can be connected to the light shielding layer 80 through the second contact hole 127. An extending portion of the drain electrode 135 can function as a second capacitor electrode such that the first capacitor electrode 112 and the second capacitor electrode constitute a capacitor. The pad electrode 145 can be a pad for applying a data signal or a gate signal to the sub-pixel. For example, the pad electrode 145 can be a data pad for applying a data signal in the first embodiment.

The source electrode 130, the drain electrode 135 and the pad electrode 145 can include a single layer or a multiple layer. When the source electrode 130, the drain electrode 135 and the pad electrode 145 have a single layer, the source electrode 130, the drain electrode 135 and the pad electrode 145 can include one or an alloy of ones selected from a group of molybdenum (Mo), aluminum (Al), chromium (Cr), gold (Au), titanium (Ti), nickel (Ni), neodymium (Nd) and copper (Cu). When the source electrode 130, the drain electrode 135 and the pad electrode 145 have a multiple layer, the source electrode 130, the drain electrode 135 and the pad electrode 145 can include a double layer of molybdenum/aluminum-neodymium (Mo/AlNd) or a triple layer of titanium/aluminum/titanium (Ti/Al/Ti), molybdenum/copper/molybdenum (Mo/Cu/Mo), molybdenum/aluminum/molybdenum (Mo/Al/Mo) or molybdenum/aluminum-neodymium/molybdenum (Mo/AlNd/Mo). In addition, the source electrode 130, the drain electrode 135 and the pad electrode 145 can include a quadruple layer of indium-tin-oxide/molybdenum/copper/molybdenum (ITO/Mo/Cu/Mo). For example, the source electrode 130, the drain electrode 135 and the pad electrode 145 can have a quadruple layer of indium-tin-oxide/molybdenum-titanium/copper/molybdenum-titanium (ITO/MoTi/Cu/MoTi) in the first embodiment. The source electrode 130, the drain electrode 135, the gate electrode 120 and the semiconductor layer 110 constitute a thin film transistor (TFT) such as a driving transistor.

A passivation layer 140 is disposed on the substrate 100 having the source electrode 130, the drain electrode 135 and the pad electrode 145. The passivation layer 140 is an insulating layer protecting elements thereunder. The passivation layer 140 can include silicon oxide (SiOx), silicon nitride (SiNx) or a multiple layer thereof. The passivation layer 140 in the sub-pixel area PIX has a first via hole 142 exposing the drain electrode 135, and the passivation layer 140 in the pad area PAD has a pad hole 143 exposing the pad electrode 145.

An overcoat layer 150 is disposed on the passivation layer 140 in the sub-pixel area PIX. The overcoat layer 150 can be a planarizing layer for mitigating a step difference of a structure thereof and can include an organic material such as polyimide, benzocyclobutene-series resin and acrylate. The overcoat layer 150 has a second via hole 152 exposing the first via hole 142 of the passivation layer 140 and the drain electrode 135.

A light emitting diode 60 is disposed on the overcoat layer 150. The light emitting diode 60 includes a first electrode 160 connected to the drain electrode 135 of the thin film transistor, a second electrode 180 facing the first electrode 160 and an organic emitting layer 175 between the first electrode 160 and the second electrode 180. The first electrode 160 can be an anode, and the second electrode 180 can be a cathode.

The first electrode 160 can be disposed on the overcoat layer 150 and can be connected to the drain electrode 135 through the second via hole 152 of the overcoat layer 150 and the first via hole 142 of the passivation layer 140. Although one first electrode 160 can be disposed in one sub-pixel, the structure of the first electrode 160 is not limited thereto. The first electrode 160 can include a transparent conductive material such as indium-tin-oxide (ITO), indium-zinc-oxide (IZO) and zinc-oxide (ZO) according to a selected emission type to function as a transparent electrode or can include a reflecting layer to function as a reflecting electrode. The reflecting electrode can include one or an alloy of ones selected from a group of aluminum (Al), copper (Co), silver (Ag) and nickel (Ni), preferably an alloy of silver/palladium/copper (APC). The first electrode 160 can include a triple layer of indium-zinc-oxide/silver/indium-tin-oxide (IZO/Ag/ITO) in the first embodiment. The first electrode 160 can include a lower layer 161 of indium-tin-oxide (ITO), a middle layer 162 of silver (Ag) and an upper layer 163 of indium-zinc-oxide (IZO).

A bank 170 is disposed on the substrate 100 having the first electrode 160. The bank 170 includes a first bank layer 172 and a second bank layer 176. The first bank layer 172 has a first open portion 173 exposing the first electrode 160, and the second bank layer 176 has a second open portion 177 exposing a portion of the first bank layer 172 and the first electrode 160. The second open portion 177 can have an area greater than that of the first open portion 173 to expose the portion of the first bank layer 172.

The organic emitting layer 175 is disposed on the substrate 100 having the bank 170 in the sub-pixel area PIX. The organic emitting layer 175 can include an emitting material layer (EML) and at least one of a hole injecting layer (HIL), a hole transporting layer (HTL), an electron transporting layer (ETL) and an electron injecting layer (EIL). The organic emitting layer 175 can be formed through a soluble fabrication process such as an inkjet printing or a nozzle coating including coating and drying steps to have a top surface of a round shape where the organic emitting layer 175 and the bank 170 contact each other. The organic emitting layer 175 can include red, green and blue emitting materials in the corresponding sub-pixel, and can emit red, green, blue and white colored lights. Alternatively, the whole sub-pixel can emit a white colored light.

The second electrode 180 is disposed on the organic emitting layer 175. The second electrode 180 can be disposed on a whole surface of the substrate 100 to have a relatively wide area. The second electrode 180 can function as a transparent electrode or a reflecting electrode according to a selected emission type. When the second electrode 180 is a transparent electrode, the second electrode 180 can include a transparent conductive material such as indium-tin-oxide (ITO) and indium-zinc-oxide (IZO) or can include one or an alloy of ones selected from a group of magnesium (Mg), calcium (Ca), aluminum (Al) and silver (Ag) having a relatively small thickness to transmit a light.

Figure 5:
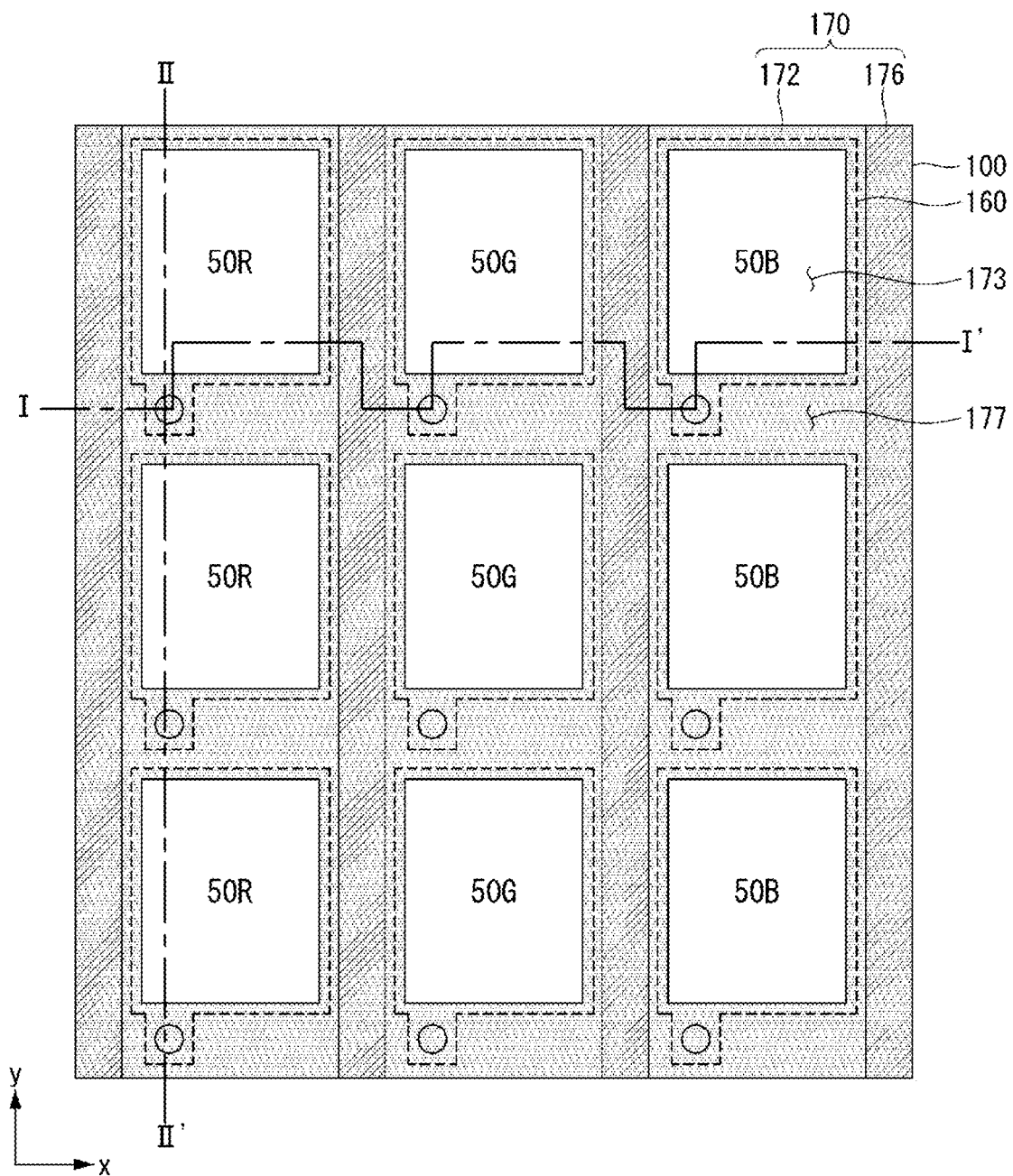
FIG. 5 is a plan view showing the organic light emitting display device according to the first embodiment of the present disclosure'

A counter substrate 190 is disposed to face the substrate 100 having the light emitting diode 60. The counter substrate 190 seals the substrate 100 and includes a color filter layer 195. The color filter layer 195 can include a red color filter to reinforce a color coordinate of a red color. For example, when a first sub-pixel is a red sub-pixel, the counter substrate 190 can include a red color filter in a region corresponding to the first sub-pixel. In addition, the counter substrate 190 may not include any color filter in regions corresponding to a second sub-pixel of a green sub-pixel and a third sub-pixel of a blue sub-pixel. In another embodiment, red, green and blue color filters can be disposed in the red, green and blue sub-pixels, respectively. The structure shown in FIG. 4 can be applied to the other sub-pixels as well as the corresponding sub-pixel. FIG. 5 is a plan view showing the organic light emitting display device according to the first embodiment of the present disclosure, FIG. 6 is a cross-sectional view taken along a line I-I' of FIG. 5, and FIG. 7 is a cross-sectional view taken along a line II-IP of FIG. 5.

Figure 6:
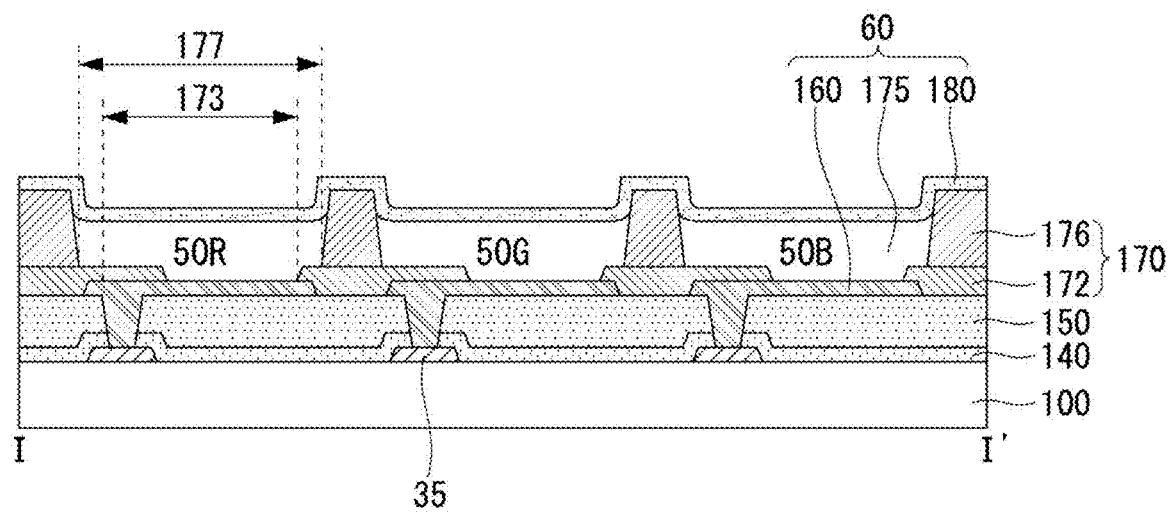
FIG. 6 is a cross-sectional view taken along a line I-I' of FIG. 5.
Figure 7:
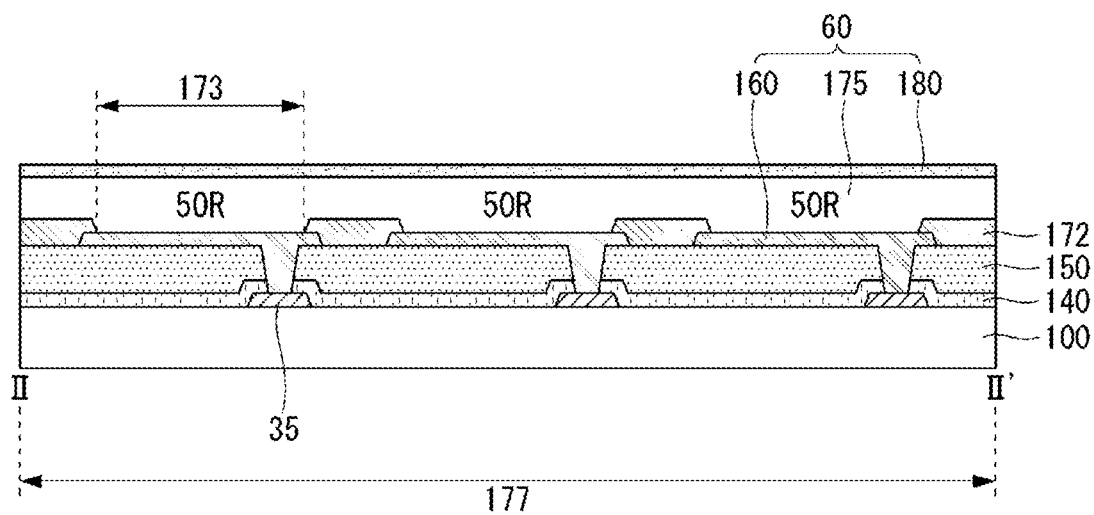
FIG. 7 is a cross-sectional view taken along a line II-IP of FIG. 5.

In FIGS. 5 and 6, the organic light emitting display device according to the first embodiment of the present disclosure includes the substrate 100 having a plurality of sub-pixels 50R, 50G and 50B. The substrate 100 can have various plan shapes. For example, the substrate 100 can have a plan shape such as a rectangular shape, a square shape, a circular shape and an elliptical shape.

The thin film transistor, the capacitor and the light emitting diode are disposed on the substrate 100. An emitting portion is defined by the bank 170 in each of the plurality of sub-pixels 50R, 50G and 50B. For illustrating the bank 170 in detail, the elements other than the bank 170 are omitted in FIG. 5.

The plurality of sub-pixels 50R, 50G and 50B can be arranged along a first direction (for example, an X-axis direction) and a second direction (for example, a Y-axis direction) crossing each other. The adjacent sub-pixels along the first direction can emit different colored lights, and the adjacent sub-pixels along the second direction can emit the same colored light. For example, the red sub-pixel 50R, the green sub-pixel 50G and the blue sub-pixel 50B can be repeatedly arranged along the first direction. The red sub-pixels 50R can be arranged in a first column along the second direction, the green sub-pixels 50G can be arranged in a second column along the second direction, and the blue sub-pixels 50B can be arranged in a third column along the second direction. In another embodiment, the plurality of sub-pixels can be variously arranged.

The first electrode 160 of the light emitting diode is disposed in each of the plurality of sub-pixels 50R, 50G and 50B. The bank 170 is disposed on the substrate 100 having the first electrode 160 to define the emitting portion. The bank 170 includes the first bank layer 172 and the second bank layer 176.

The first bank layer 172 is disposed on the first electrode 160 to cover an edge portion of the first electrode 160. The first bank layer 172 has the first open portion 173 exposing a portion of the first electrode 160. The single first open portion 173 exposes the single first electrode 160. As a result, the first open portion 173 can correspond to the first electrode 160 in a one-to-one relationship.

The first bank layer 172 can have a relatively small thickness to be covered with the organic emitting layer in a subsequent fabrication process. The first bank layer 172 can have a hydrophilicity. For example, the first bank layer 172 can include a hydrophilic inorganic material such as silicon oxide (SiOx) and silicon nitride (SiNx).

Although the first open portion 173 exemplarily has a rectangular shape in FIG. 5, the shape of the first open portion 173 is not limited thereto. Although the first open portions 173 have the same shape and the same area in FIG. 5, the shape and the area of the first open portions are not limited thereto. For example, at least two first open portions 173 can have different shapes and/or different areas in another embodiment. The shape and/or the area of the first open portion 173 can be properly determined based on a lifetime of an emitting material for the organic emitting layer of the light emitting diode. The portion of the first electrode 160 exposed through the first open portion 173 can be defined as the emitting portion.

The second bank layer 176 is disposed on the substrate 100 having the first bank layer 172. The second bank layer 176 is disposed between the sub-pixels emitting different colored lights. The second bank layer 176 has the second open portion 177 exposing a portion of the first electrode 160. The second open portions 177 are arranged to be parallel to each other along the first direction. In addition, the second open portions 177 extend along the second direction, respectively, to expose the first electrodes 160 along the second direction in the sub-pixels and to expose the first open portions 173 along the second direction.

The second bank layer 176 can have a hydrophobicity. For example, the second bank layer 176 can include a hydrophobic organic material or an insulating material coated by a hydrophobic organic material. An emitting material for the organic emitting layer can be pushed toward a central region of the emitting portion to be centralized due to the hydrophobicity of the second bank layer 176. In addition, the second bank layer 176 can function as a barrier confining the dispensed emitting material to prevent the emitting material of different colors from being mixed.

Although the second open portion 177 has a bar shape in FIG. 5, the shape of the second open portion 177 is not limited thereto. Although the second open portions 177 have the same shape and the same area in FIG. 5, the shape and/or the area of the second open portions are not limited thereto. For example, at least two second open portions 177 can have different shapes and/or different areas in another embodiment. The shape and/or the area of the second open portion 177 can be properly determined based on a lifetime of the emitting material for the organic emitting layer of the light emitting diode.

The second open portion 177 is disposed outside the first open portion 173 to be spaced apart from the first open portion 173. As a result, the first open portion 173 can be exposed through the second open portion 177, and the first bank layer 172 can be exposed through the second open portion 177.

With reference to FIGS. 6 and 7, structures of the first electrode, the bank, the organic emitting layer and the second electrode will be illustrated hereinafter. In FIGS. 6 and 7, a driving transistor 35 of the thin film transistor is disposed under the passivation layer 140. The driving transistor 35 can have the structure of the semiconductor layer 110, the gate electrode 120, the source electrode 130 and the drain electrode 135 in FIG. 4. The light shielding layer 80 of the sub-pixel area PIX and the pad electrode 145 of the pad area PAD are omitted in FIGS. 6 and 7.

The driving transistor 35 is disposed on the substrate 100. The passivation layer 140 is disposed on the driving transistor 35, and the overcoat layer 150 is disposed on the passivation layer 140. The first electrode 160 is disposed on the overcoat layer 150 in each sub-pixel and is connected to the driving transistor 35 through via holes of the passivation layer 140 and the overcoat layer 150. The edge portion of the first electrode 160 is covered with the first bank layer 172, and a portion of the first electrode 160 is exposed through the first bank layer 172. The second bank layer 176 is disposed on the first bank layer 172.

The organic emitting layer 175 is disposed on the substrate having the second bank layer 176. The organic emitting layer 175 can be disposed along an extension direction of the second open portion 177 in the second open portion 177 of the second bank layer 176. the emitting material dispensed in the single second open portion 177 covers the first electrode 160 and the first bank layer 172 exposed through the second open portion 177. The emitting material can completely cover the first bank layer 172 in the second open portion 177 such that the emitting material is not divided by the first bank layer 172 and is divided by the second bank layer 176.

The emitting material of the same color is dispensed on the plurality of first electrodes 160 exposed through the single second open portion 177. As a result, the plurality of sub-pixels corresponding to the single second open portion 177 can emit the same colored light. The plan shape of the organic emitting layer 175 corresponds to the plan shape of the second open portion 177. For example, the organic emitting layer 175 and the second open portion 177 can have a bar shape.

The emitting materials of different colors can be sequentially and alternatively dispensed in the second open portions 177, respectively. The emitting materials of different colors can emit red (R), green (G) and blue (B) colored lights.

The second bank layer 176 is disposed between the adjacent first electrodes 160 along the first direction (an X-axis direction of FIG. 5) to prevent the emitting materials of different colors dispensed in the adjacent second open portions 177 along the first direction from being mixed. The emitting materials of different colors dispensed in the different second open portions are physically divided by the second bank layer 176.

During the soluble fabrication process, the emitting material used for forming the organic emitting layer 175 is dispensed to cover a portion of the first electrode 160, a portion of the first bank layer 172 and a portion of the second bank layer 176. For preventing wettability deterioration due to the hydrophobicity of the first electrode 160, the first bank layer 172 can include a hydrophilic material of a relatively small thickness and the hydrophilic emitting material can be induced to be uniformly dispersed on the first electrode 160. The second bank layer 176 can include a hydrophobic material of a relatively great thickness and the hydrophilic emitting material can be pushed toward a central region of the emitting portion. The organic emitting layer 175 can have a relatively uniform thickness in the emitting portion due to the first and second bank layers 172 and 176.

The plurality of sub-pixels emitting the same colored lights can correspond to the single second open portion 177. When each second open portion 177 exposes the single sub-pixel, the emitting materials dispensed in the second open portions 177 can have different thicknesses due to an apparatus deviation in the soluble fabrication process. The apparatus deviation can include deviation of a discharge amount between nozzles of an inkjet apparatus. For example, each nozzle used for dispensing the emitting material on the second open portion 177 can have a non-uniform discharge amount, and the emitting material dispensed in each sub-pixel through the nozzle corresponding to the single sub-pixel can have the different thickness according to the position.

In the first embodiment, since the plurality of sub-pixels emitting the same colored light are assigned to the single second open portion 177 and the plurality of nozzles corresponding to the plurality of sub-pixels are assigned to the single second open portion 177, the emitting material dispensed in the plurality of second open portions 177 can have a uniform thickness due to compensation of deviation of a discharge amount between the nozzles.

In the organic light emitting display device according to the first embodiment of the present disclosure, since reduction of the thickness uniformity of the organic emitting layer 175 is prevented, deterioration in display quality due to the thickness deviation in the sub-pixel is prevented. In addition, since the uniformity of the organic emitting layer 175 is obtained, deterioration such that a lifetime of an element is shortened and a dark point is generated is prevented.

A predetermined distance between a boundary of the first bank layer 172 and a boundary of the second bank layer 176 can be a minimum distance for obtaining the thickness uniformity of the organic emitting layer 175. When the boundary of the first bank layer 172 and the boundary of the second bank layer 176 are separated by a gap smaller than the predetermined distance, the uniformity of the organic emitting layer 175 is not obtained. When the boundary of the first bank layer 172 and the boundary of the second bank layer 176 are separated by a gap greater than the predetermined distance, an area of the first electrode 160 blocked by the first bank layer 172 increases and aperture ratio is reduced.

In the organic light emitting display device according to the first embodiment of the present disclosure, since the second open portion 177 of the second bank layer 176 extends along the second direction, the second bank layer 177 is not disposed between the adjacent sub-pixels along the second direction. As a result, since the position limitation to the first bank layer 172 is reduced, a degree of design freedom is improved and a relatively wide emission region on the first electrode 160 is obtained. Accordingly, the degree of design freedom is improved and the organic light emitting display device having the sufficient aperture ratio is provided.

Further, as the resolution increases, the area of the sub-pixels in the display device is relatively reduced. In this case, since the emitting material is not dispensed in a proper position, deterioration of color mixture resulting from that the organic emitting layers 175 of different colors are mixed can occur. In the organic light emitting display device according to the first embodiment of the present disclosure, since a dispensing area of the emitting material is sufficiently obtained due to the relatively wide second open portion 177 corresponding to the plurality of sub-pixels, deterioration of color mixture is improved.

Figure 8:
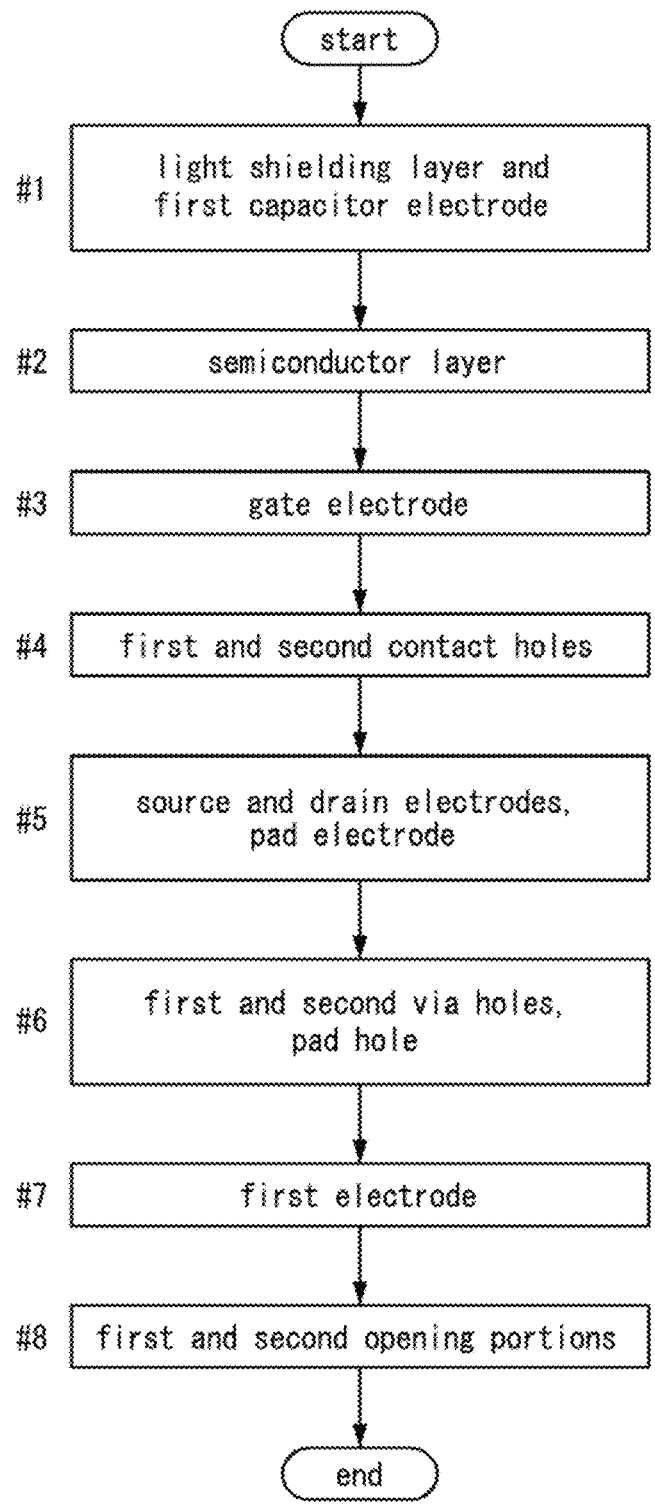
FIG. 8 is a flow chart showing a fabrication process of the organic light emitting display device according to the first embodiment of the present disclosure.
Figure 9:
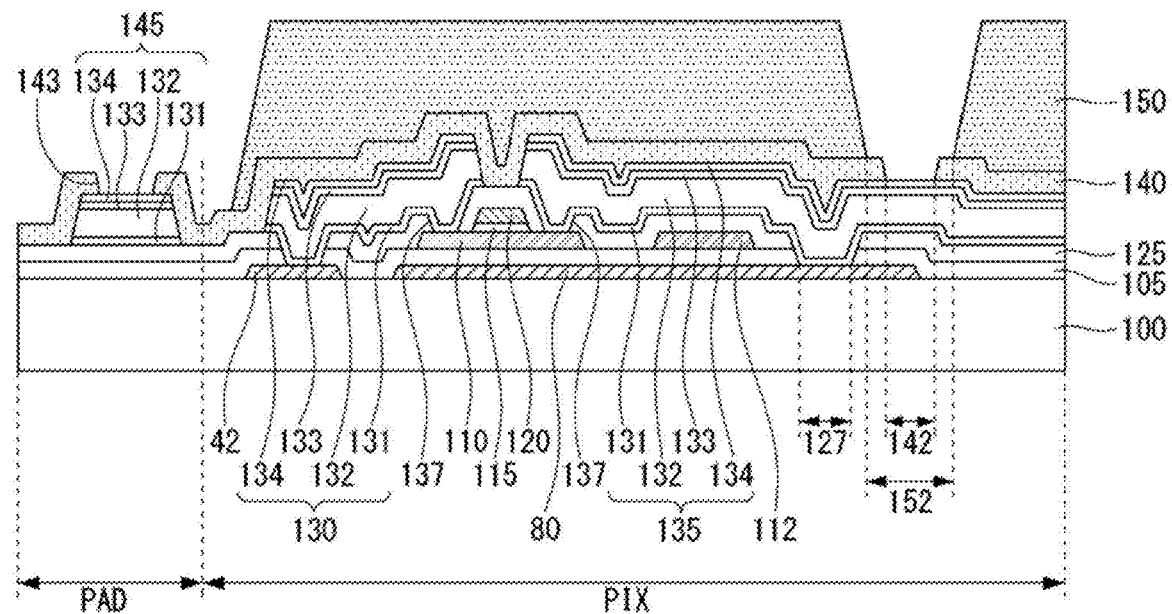
FIG. 9 is a cross-sectional view showing a sixth mask process of the organic light emitting display device according to the first embodiment of the present disclosure.
Figure 10:
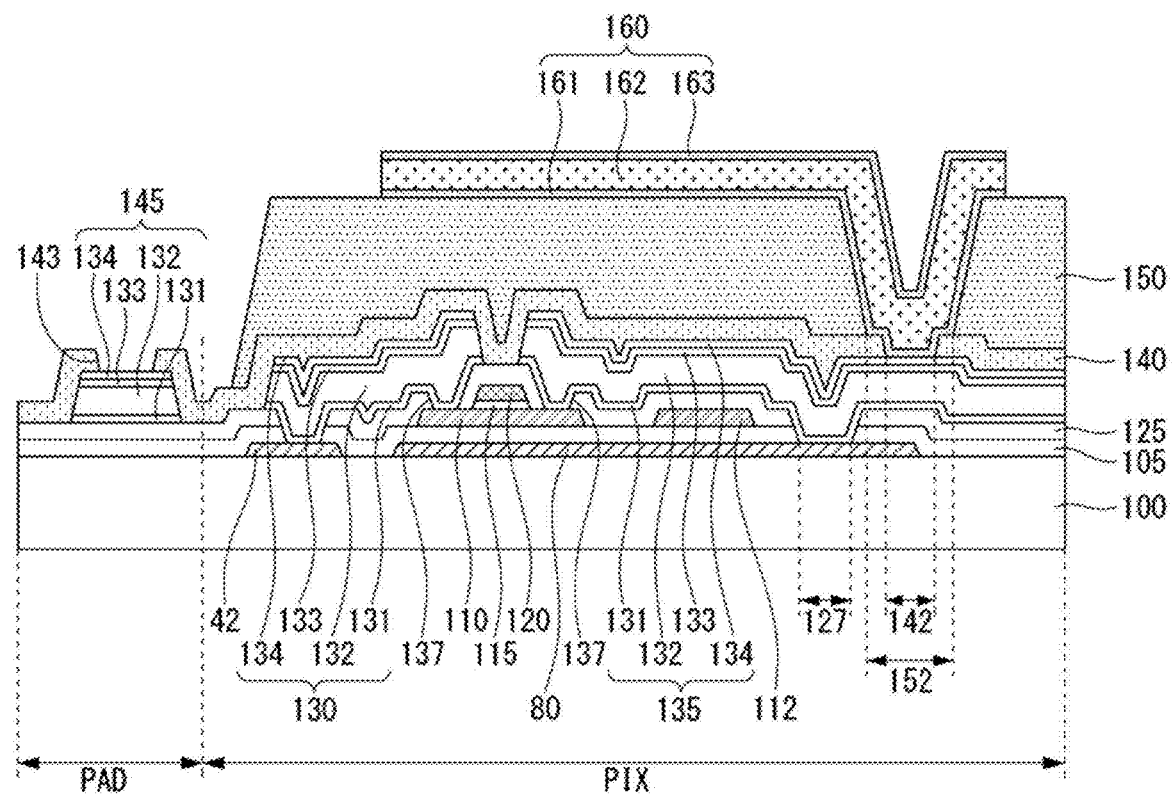
FIG. 10 is a cross-sectional view showing a seventh mask process of the organic light emitting display device according to the first embodiment of the present disclosure.
Figure 11:
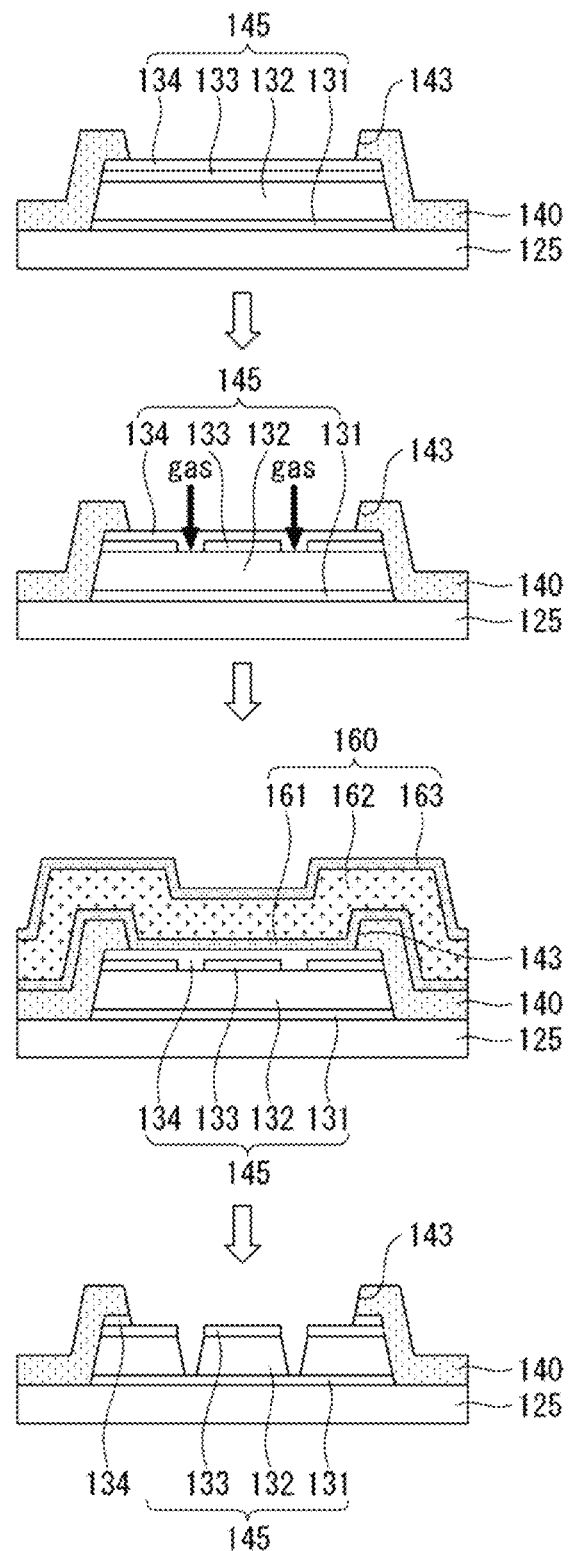
FIG. 11 is a cross-sectional view showing a pad electrode of a pad area through sixth and seventh mask processes of the organic light emitting display device according to the first embodiment of the present disclosure.
Figure 12:
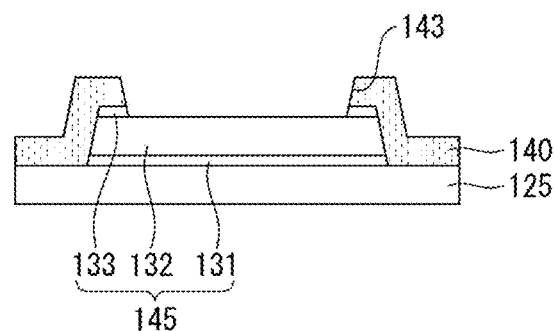
FIG. 12 is a cross-sectional view showing a pad electrode of a pad area through sixth and seventh mask processes of an organic light emitting display device according to a second embodiment of the present disclosure.
Figure 12:
Figure 12:
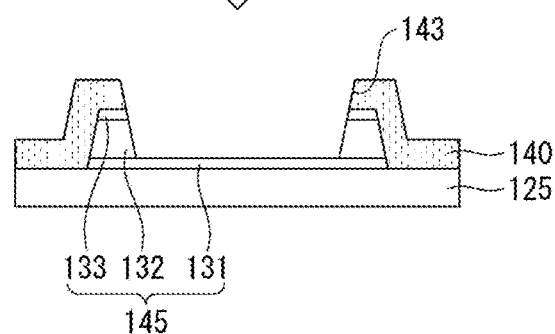
Figure 13:
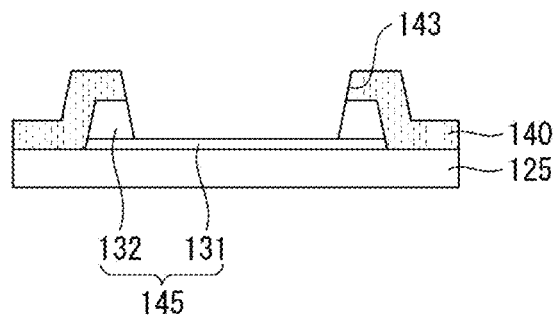
FIG. 13 is a cross-sectional view showing a pad electrode of a pad area through a seventh mask process of an organic light emitting display device according to a third embodiment of the present disclosure.
Figure 14:
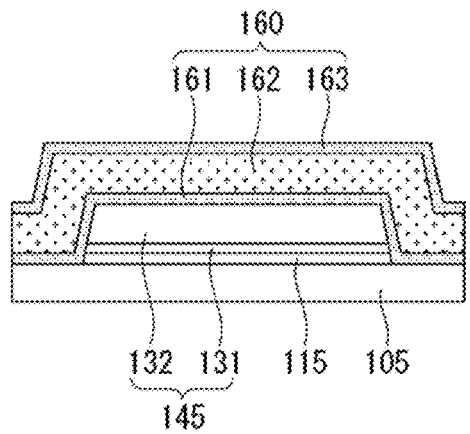
FIG. 14 is a cross-sectional view showing a pad electrode of a pad area through a seventh mask process of an organic light emitting display device according to a fourth embodiment of the present disclosure.
Figure 14:
Figure 14:
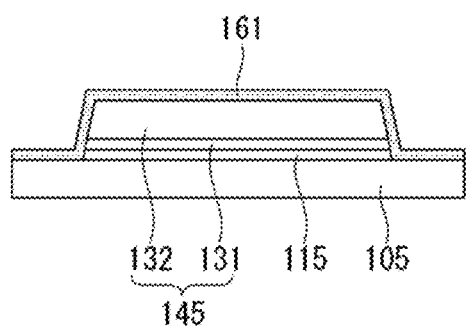
Figure 15:
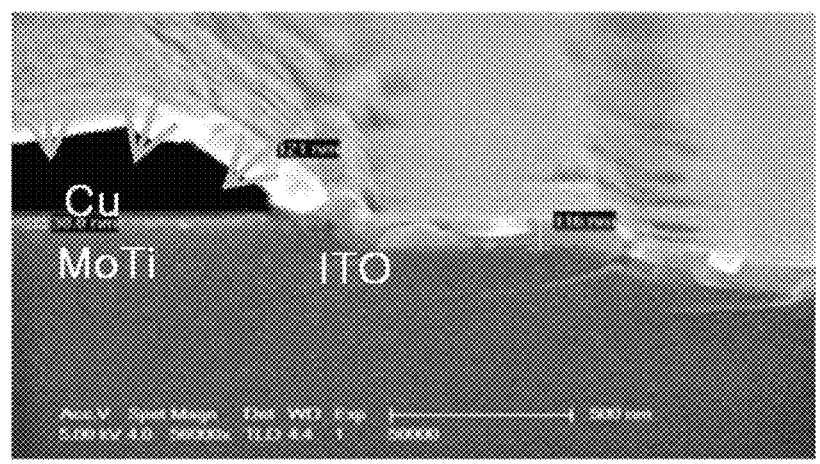
FIG. 15 is a SEM image showing a pad electrode of FIG. 14.

FIG. 8 is a flow chart showing a fabrication process of the organic light emitting display device according to the first embodiment of the present disclosure, FIG. 9 is a cross-sectional view showing a sixth mask process of the organic light emitting display device according to the first embodiment of the present disclosure, FIG. 10 is a cross-sectional view showing a seventh mask process of the organic light emitting display device according to the first embodiment of the present disclosure, FIG. 11 is a cross-sectional view showing a pad electrode of a pad area through the sixth and seventh mask processes of the organic light emitting display device according to the first embodiment of the present disclosure, and FIG. 12 is a cross-sectional view showing a pad electrode of a pad area through sixth and seventh mask processes of an organic light emitting display device according to a second embodiment of the present disclosure. FIG. 13 is a cross-sectional view showing a pad electrode of a pad area through a seventh mask process of an organic light emitting display device according to a third embodiment of the present disclosure, and FIG. 14 is a cross-sectional view showing a pad electrode of a pad area through a seventh mask process of an organic light emitting display device according to a fourth embodiment of the present disclosure. FIG. 15 is a SEM image showing a pad electrode of FIG. 14.

In FIGS. 4 and 8, the organic light emitting display device according to the first embodiment of the present disclosure can be fabricated through a fabrication process using eight photomasks.

The light shielding layer 80 and the first source line 42 are formed on the substrate 100 through a first mask process #1. Next, the buffer layer 105 is formed on the light shielding layer 80 and the first source line 42. The semiconductor layer 110 and the first capacitor electrode 112 are formed on the buffer layer 105 through a second mask process #2. Next, the gate insulating layer 115 is formed on the substrate 100 having the semiconductor layer 110. The gate electrode 120 is formed on the gate insulating layer 115 through a third mask process #3. Next, the interlayer insulating layer 125 is formed on the substrate 100 having the gate electrode 120.

The first and second contact holes 137 and 127 are formed in the interlayer insulating layer 125 and the buffer layer 105 by etching the interlayer insulating layer 125 and the buffer layer 105 through a fourth mask process #4. The source electrode 130 and the drain electrode 135 are formed on the interlayer insulating layer 125 and the pad electrode 145 is formed on the interlayer insulating layer 125 of the pad area PAD through a fifth mask process #5. The source electrode 130, the drain electrode 135 and the pad electrode 145 can have a structure including a first layer 131 of molybdenum (Mo), a second layer 132 of copper (Cu), a third layer 133 of molybdenum-titanium (MoTi) and a fourth layer 134 of indium-tin-oxide (ITO). Next, the passivation layer 140 and the overcoat layer 150 are sequentially formed on the substrate 100 having the source electrode 130, the drain electrode 135 and the pad electrode 145. The first via hole 142, the second via hole 152 and the pad hole 143 are formed in the overcoat layer 150 and the passivation layer 140 through a sixth mask process #6.

The first electrode 160 is formed on the overcoat layer 150 through a seventh mask process #7. Next, the bank 170 having the first open portion 173 and the second open portion 177 is formed on the substrate 100 having the first electrode 160 through an eighth mask process #8. The organic emitting layer 175 is formed in the first open portion 173 and the second open portion 177 through a soluble fabrication process, and the second electrode 180 is formed on the substrate 100 having the organic emitting layer 175.

The detailed sixth and seventh mask processes of the first embodiment of the present disclosure will be illustrated hereinafter.

In FIGS. 9 and 11, the first via hole 142 and the pad hole 143 are formed by etching the passivation layer 140 through the sixth mask process #6. During the etching step of the passivation layer 140, the fourth layer 134 of indium-tin-oxide (ITO) of the pad electrode 145 is poly-crystallized. Next, during the ashing step of the overcoat layer 150, the third layer 133 of molybdenum-titanium (MoTi) can be deteriorated by an ashing gas through the fourth layer 134 of the pad electrode 145. Since the fourth layer 134 of indiumtin-oxide (ITO) has an excellent crystallinity, the ashing gas can permeate a grain boundary of the fourth layer 134.

In FIGS. 10 and 11, the lower layer 161, the middle layer 162 and the upper layer 163 of the first electrode 160 are sequentially formed and etched through the seventh mask process #7. Here, a silver (Ag) etchant used in the etching step of the first electrode 160 can permeate the lower second layer 132 of copper (Cu) through the defected third layer 133 of the pad electrode 145 to etch copper (Cu). As a result, the pad electrode 145 can be influenced by the etchant.

Although the source electrode 130, the drain electrode 135 and the pad electrode 145 exemplarily have the quadruple layer in the first embodiment, the source electrode 130, the drain electrode 135 and the pad electrode 145 can have a triple layer of molybdenum-titanium/copper/molybdenum-titanium (MoTi/Cu/MoTi) in a second embodiment, as shown in FIG. 12.

In FIG. 12, during the sixth mask process #6, an ashing gas used in the ashing step of the overcoat layer 150 can deteriorate the third layer 133 of molybdenum-titanium (MoTi) such that the third layer 133 is removed. During the seventh mask process #7, the lower layer 161, the middle layer 162 and the upper layer 163 of the first electrode 160 are sequentially formed and etched. Here, a silver (Ag) etchant used in the etching step of the first electrode 160 can etch the exposed second layer 132 of copper (Cu) of the pad electrode 145. As a result, the pad electrode 145 can be influenced by the etchant.

Although the source electrode 130, the drain electrode 135 and the pad electrode 145 exemplarily have the quadruple layer and the triple layer in the first and second embodiments, the source electrode 130, the drain electrode 135 and the pad electrode 145 can have a double layer of molybdenum-titanium/copper (MoTi/Cu) in a third embodiment, as shown in FIG. 13.

In FIG. 13, during the seventh mask process #7, the lower layer 161, the middle layer 162 and the upper layer 163 of the first electrode 160 are sequentially formed and etched. Here, a silver (Ag) etchant used in the etching step of the first electrode 160 can etch the exposed second layer 132 of copper (Cu) of the pad electrode 145. As a result, the pad electrode 145 can be influenced by the etchant.

In a fourth embodiment, the pad electrode 145 in the pad area PAD can be simultaneously formed with the gate electrode having a double layer of copper/molybdenum-titanium (Co/MoTi), the passivation layer can expose the pad area PAD, and a surface of the pad electrode 145 can be covered with and protected by the lower layer 162 of the first electrode 160, as shown in FIG. 14.

In FIG. 14, the gate insulating layer 115 is formed on the buffer layer 105, and the pad electrode 145 including the first layer 131 of molybdenum-titanium (MoTi) and the second layer 132 of copper (Cu) is formed on the gate insulating layer 115. During the seventh mask process, the lower layer 161 of indium-tin-oxide (ITO), the middle layer 162 of silver (Ag) and the upper layer 163 of indium-zinc-oxide (ITO) of the first electrode 160 are sequentially formed and etched. After the upper layer 163 is etched, the middle layer 162 of silver (Ag) is etched using the silver (Ag) etchant. In FIG. 15, the silver etchant can permeate the second layer 132 of copper (Cu) of the lower pad electrode 145 through the grain boundary of the lower layer 161 of indium-tin-oxide (ITO) to etch the second layer 132. As a result, the pad electrode 145 can be influenced by the etchant.

An organic light emitting display device fabricated through a fabrication process using ten photomasks will be illustrated hereinafter. The elements having the same structure as those of FIG. 4 can be designated by the same reference number.

Figure 16:
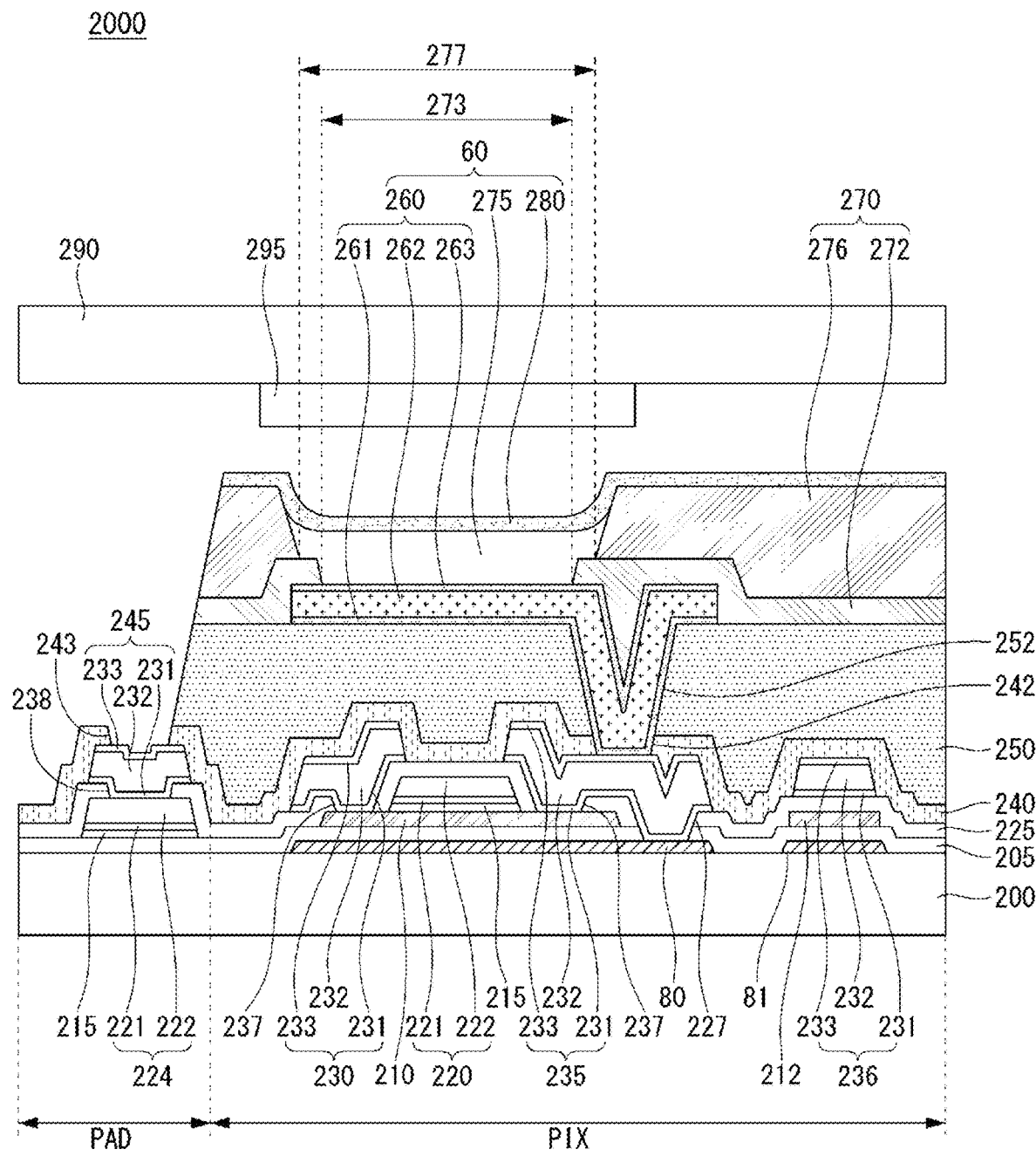
FIG. 16 is a cross-sectional view showing an organic light emitting display device according to a fifth embodiment of the present disclosure.
Figure 17:
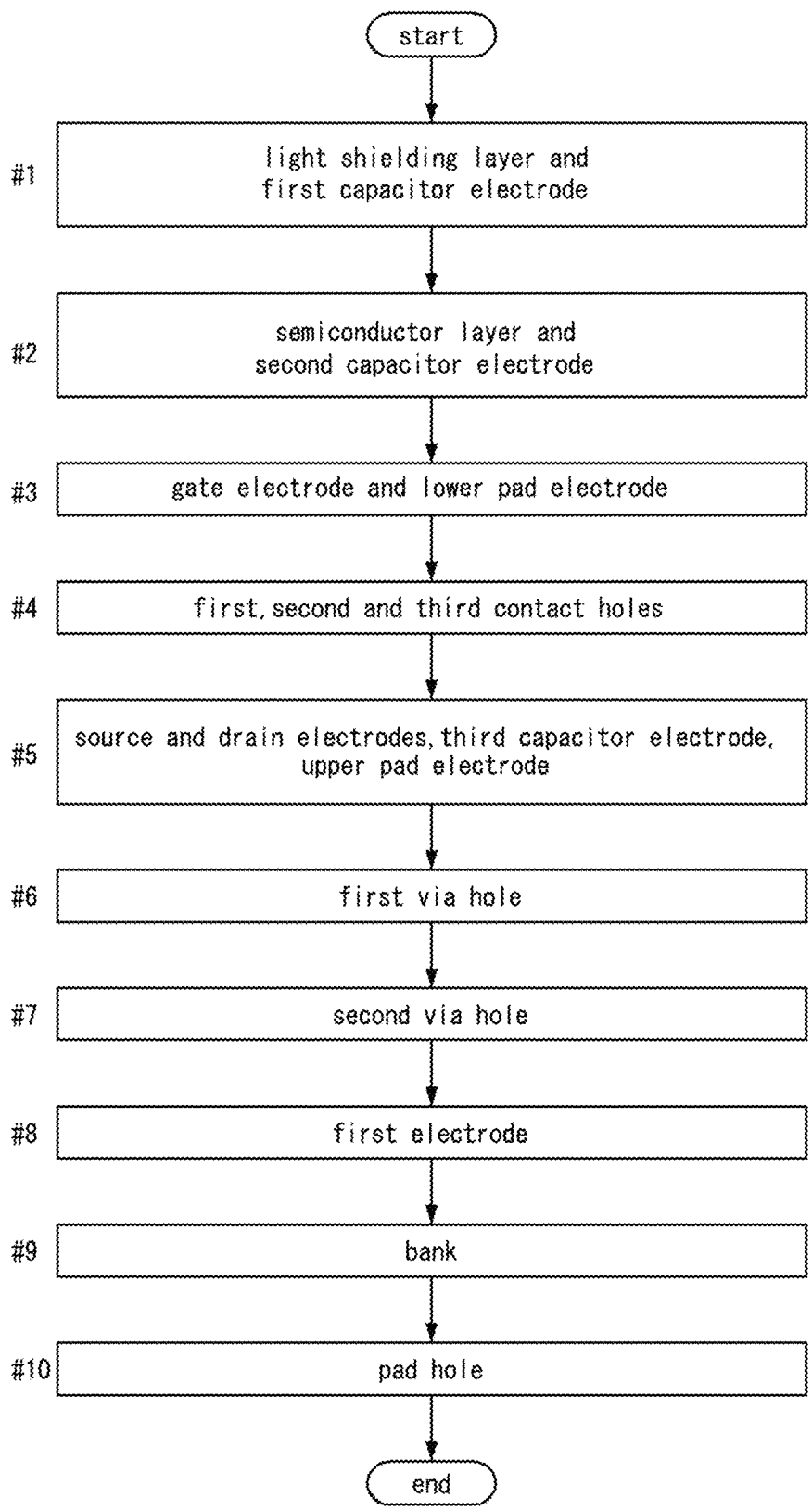
FIG. 17 is a flow chart showing a fabrication process of the organic light emitting display device according to the fifth embodiment of the present disclosure.

FIG. 16 is a cross-sectional view showing an organic light emitting display device according to a fifth embodiment of the present disclosure, and FIG. 17 is a flow chart showing a fabrication process of the organic light emitting display device according to the fifth embodiment of the present disclosure.

In FIG. 16, the organic light emitting display (OLED) device 2000 according to the fifth embodiment of the present disclosure includes a substrate 200 having a sub-pixel area PIX and a pad area PAD. A light shielding layer 80 and a first capacitor electrode 81 are disposed on the substrate 200. A buffer layer 205 is disposed on the light shielding layer 80 and the first capacitor electrode 82, and a semiconductor layer 210 and a second capacitor electrode 212 spaced apart from each other are disposed on the buffer layer 205.

A gate insulating layer 215 is disposed on the semiconductor layer 210 and the buffer layer 205 in the pad area PAD. A gate electrode 220 is disposed on the gate insulating layer 215 corresponding to a region of the semiconductor layer 210, and a lower pad electrode 224 is disposed on the gate insulating layer in the pad area PAD. The gate electrode 220 and the lower pad electrode 224 can include one or an alloy of ones selected from a group of molybdenum (Mo), aluminum (Al), chromium (Cr), gold (Au), titanium (Ti), nickel (Ni), neodymium (Nd) and copper (Cu). In addition, the gate electrode 220 and the lower pad electrode 224 can include a multiple layer including one or an alloy of ones selected from a group of molybdenum (Mo), aluminum (Al), chromium (Cr), gold (Au), titanium (Ti), nickel (Ni), neodymium (Nd) and copper (Cu). For example, the gate electrode 220 and the lower pad electrode 224 can include a double layer of molybdenum/aluminum-neodymium (Mo/AlNd), molybdenum/aluminum (Mo/Al) or molybdenum-titanium/copper (MoTi/Cu). In the fifth embodiment, the gate electrode 220 and the lower pad electrode 224 can have a double layer including a first gate layer of molybdenum-titanium (MoTi) and a second gate layer of copper (Cu).

An interlayer insulating layer 225 is disposed on the substrate 200 having the gate electrode 220 and the lower pad electrode 224. A source electrode 230, a drain electrode 235 and a third capacitor electrode 236 are disposed on the interlayer insulating layer 225 in the sub-pixel area PIX, and an upper pad electrode 245 is disposed on the interlayer insulating layer 225 in the pad area PAD. The interlayer insulating layer 225 has two first contact holes 237 exposing a source region and a drain region of the semiconductor layer 210, and the source electrode 230 and the drain electrode 235 are connected to the semiconductor layer 210 through the two first contact holes 237. In addition, the interlayer insulating layer 225 and the buffer layer 205 can have a second contact hole 227 exposing the light shielding layer 80, and the drain electrode 235 can be connected to the light shielding layer 80 through the second contact hole 227. The third capacitor electrode 236 and the second capacitor electrode 212 constitute a capacitor. The interlayer insulating layer 225 can have a third contact hole 238 exposing the lower pad electrode 224, and the upper pad electrode 245 can be connected to the lower pad electrode 224 through the third contact hole 238.

The source electrode 230, the drain electrode 235, the third capacitor electrode 236 and the upper pad electrode 245 can include a single layer or a multiple layer. When the source electrode 230, the drain electrode 235, the third capacitor electrode 236 and the upper pad electrode 245 have a single layer, the source electrode 230, the drain electrode 235, the third capacitor electrode 236 and the upper pad electrode 245 can include one or an alloy of ones selected from a group of molybdenum (Mo), aluminum (Al), chromium (Cr), gold (Au), titanium (Ti), nickel (Ni), neodymium (Nd) and copper (Cu). When the source electrode 230, the drain electrode 235, the third capacitor electrode 236 and the upper pad electrode 245 have a multiple layer, the source electrode 230, the drain electrode 235, the third capacitor electrode 236 and the upper pad electrode 245 can include a double layer of molybdenum/aluminum-neodymium (Mo/AlNd) or a triple layer of titanium/aluminum/titanium (Ti/Al/Ti), molybdenum/copper/molybdenum (Mo/Cu/Mo), molybdenum/aluminum/molybdenum (Mo/Al/Mo) or molybdenum/aluminum-neodymium/molybdenum (Mo/AlNd/Mo). In addition, the source electrode 230, the drain electrode 235, the third capacitor electrode 236 and the upper pad electrode 245 can include a quadruple layer of indium-tin-oxide/molybdenum/copper/molybdenum (ITO/Mo/Cu/Mo). In the fifth embodiment, the source electrode 230, the drain electrode 235, the third capacitor electrode 236 and the upper pad electrode 245 can have a triple layer including a first layer 231 of molybdenum-titanium (MoTi), a second layer 232 of copper (Cu) and a third layer 233 of molybdenum-titanium (MoTi). The source electrode 230, the drain electrode 235, the gate electrode 220 and the semiconductor layer 210 constitute a thin film transistor (TFT) such as a driving transistor.

A passivation layer 240 is disposed on the substrate 200 having the source electrode 230, the drain electrode 235, the third capacitor electrode 236 and the upper pad electrode 245. The passivation layer 240 in the sub-pixel area PIX has a first via hole 242 exposing the drain electrode 235, and the passivation layer 240 in the pad area PAD has a pad hole 243 exposing the upper pad electrode 245.

An overcoat layer 250 is disposed on the passivation layer 240 in the sub-pixel area PIX. The overcoat layer 250 has a second via hole 252 exposing the first via hole 242 of the passivation layer 240 and the drain electrode 235.

A light emitting diode 60 is disposed on the overcoat layer 250. The light emitting diode 60 includes a first electrode 260 connected to the drain electrode 235 of the thin film transistor, a second electrode 280 facing the first electrode 260 and an organic emitting layer 275 between the first electrode 260 and the second electrode 280. The first electrode 260 can be an anode, and the second electrode 280 can be a cathode.

The first electrode 260 can be disposed on the overcoat layer 250 and can be connected to the drain electrode 235 through the second via hole 252 of the overcoat layer 250 and the first via hole 242 of the passivation layer 240. The first electrode 260 can include a triple layer of indium-zinc-oxide/silver/indium-tin-oxide (IZO/Ag/ITO) in the fifth embodiment. The first electrode 260 can include a lower layer 261 of indium-tin-oxide (ITO), a middle layer 262 of silver (Ag) and an upper layer 263 of indium-zinc-oxide (IZO).

A bank 270 is disposed on the substrate 200 having the first electrode 260. The bank 270 includes a first bank layer 272 and a second bank layer 276. The first bank layer 272 has a first open portion 273 exposing the first electrode 260, and the second bank layer 276 has a second open portion 277 exposing a portion of the first bank layer 272 and the first electrode 260. The organic emitting layer 275 is disposed on the substrate 200 having the bank 270 in the sub-pixel area PIX. The second electrode 280 is disposed on the organic emitting layer 275.

A counter substrate 290 is disposed to face the substrate 200 having the light emitting diode 60. The counter substrate 290 seals the substrate 200 and includes a color filter layer 295.

The organic light emitting display device according to the fifth embodiment of the present disclosure can be fabricated through a fabrication process using ten photomasks.

In FIGS. 16 and 17, the light shielding layer 80 and the first capacitor electrode 81 are formed on the substrate 200 through a first mask process #1. Next, the buffer layer 205 is formed on the light shielding layer 80 and the first capacitor electrode 81. The semiconductor layer 210 and the first capacitor electrode 212 are formed on the buffer layer 205 through a second mask process #2. Next, the gate insulating layer 215 is formed on the substrate 200 having the semiconductor layer 210. The gate electrode 220 and the lower pad electrode 224 are formed on the gate insulating layer 215 through a third mask process #3. Next, the interlayer insulating layer 225 is formed on the substrate 200 having the gate electrode 220 and the lower pad electrode 224.

The first, second and third contact holes 237, 227 and 238 are formed in the interlayer insulating layer 225 and the buffer layer 205 by etching the interlayer insulating layer 225 and the buffer layer 205 through a fourth mask process #4. The source electrode 230, the drain electrode 235 and the third capacitor electrode 236 are formed on the interlayer insulating layer 225 and the upper pad electrode 245 is formed on the interlayer insulating layer 225 of the pad area PAD through a fifth mask process #5. Next, the passivation layer 240 is formed on the substrate 200 having the source electrode 230, the drain electrode 235, the third capacitor electrode 236 and the upper pad electrode 245, and the first via hole 242 is formed in the passivation layer 240 through a sixth mask process #6. The overcoat layer 250 is coated on the substrate 200 having the passivation layer 240, and the second via hole 252 is formed in the overcoat layer 250 through a seventh mask process #7.

The first electrode 260 is formed on the overcoat layer 250 through an eighth mask process #8. Next, the bank 270 is formed on the substrate 200 having the first electrode 260, and the first open portion 273 and the second open portion 277 are formed in the bank 270 through a ninth mask process #9. The organic emitting layer 275 is formed in the first open portion 273 and the second open portion 277 through a soluble fabrication process, and the second electrode 280 is formed on the substrate 200 having the organic emitting layer 275. Next, the pad hole 243 is formed in the pad area PAD through a tenth mask process #10 to complete the organic light emitting display device.

In another embodiment, the number of photomasks is reduced and influence on the pad electrode of the pad area by the etchant is prevented.

Figure 18:
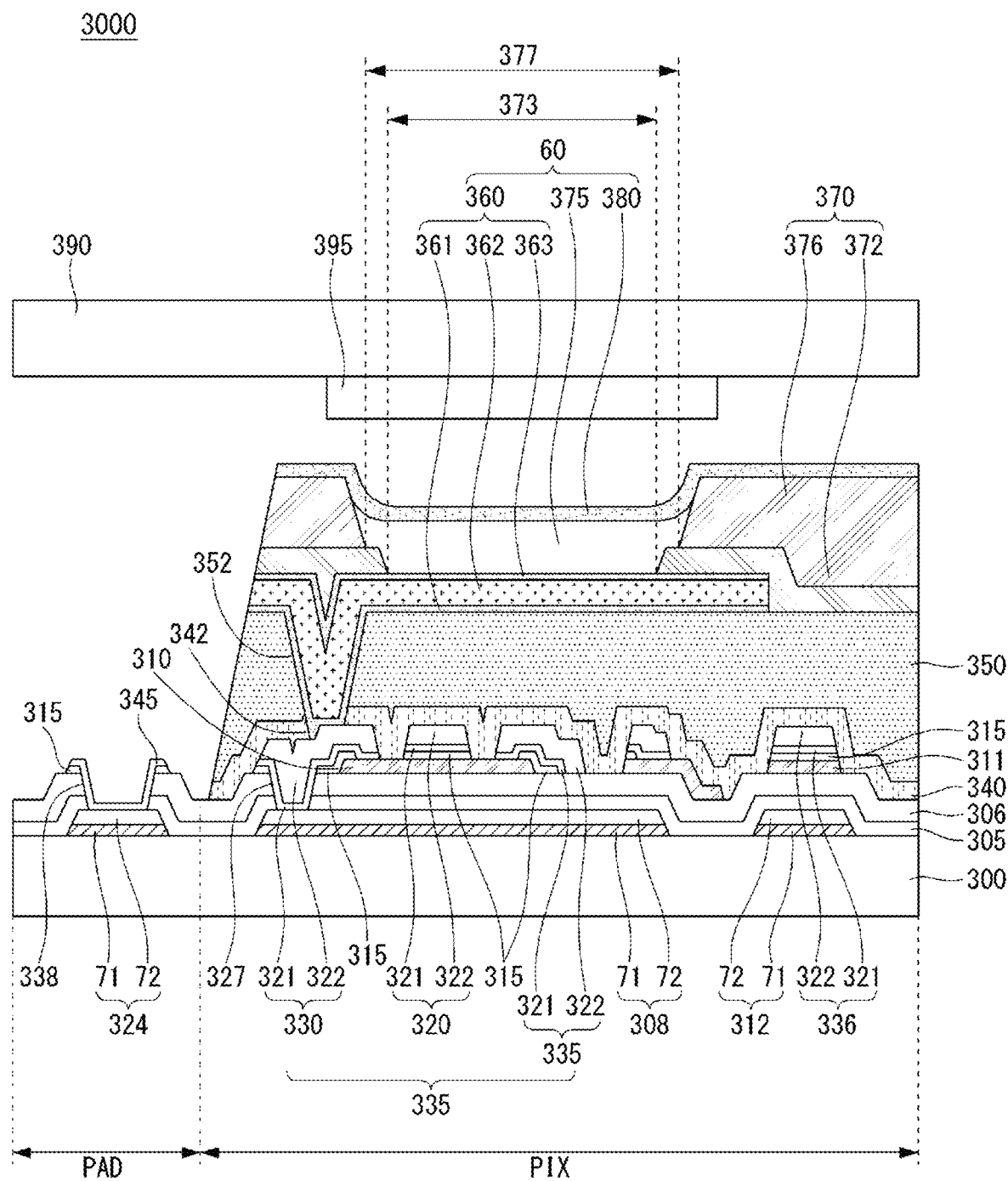
FIG. 18 is a cross-sectional view showing an organic light emitting display device according to a sixth embodiment of the present disclosure.
Figure 19:
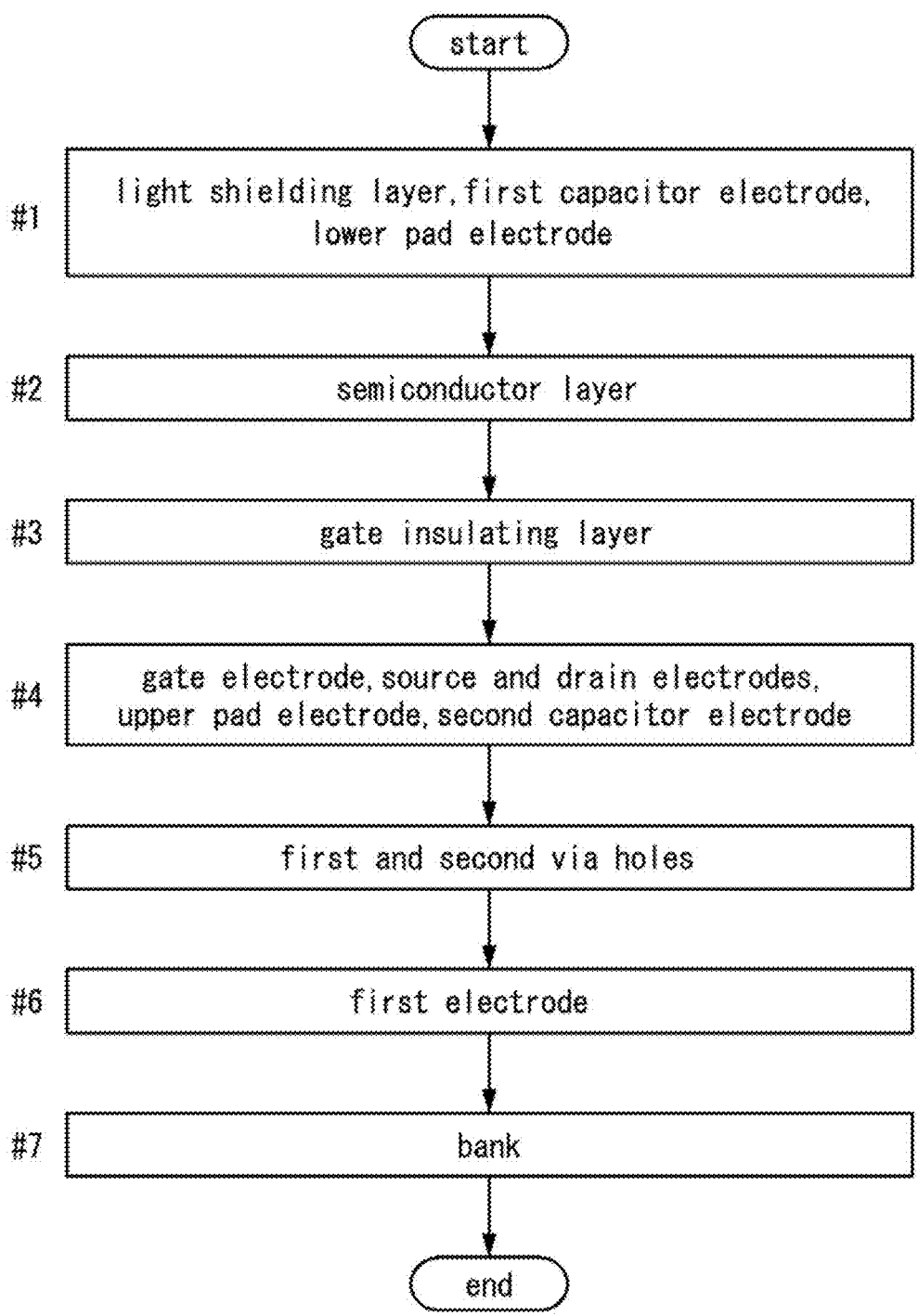
FIG. 19 is a flow chart showing a fabrication process of the organic light emitting display device according to the sixth embodiment of the present disclosure.
Figure 20:
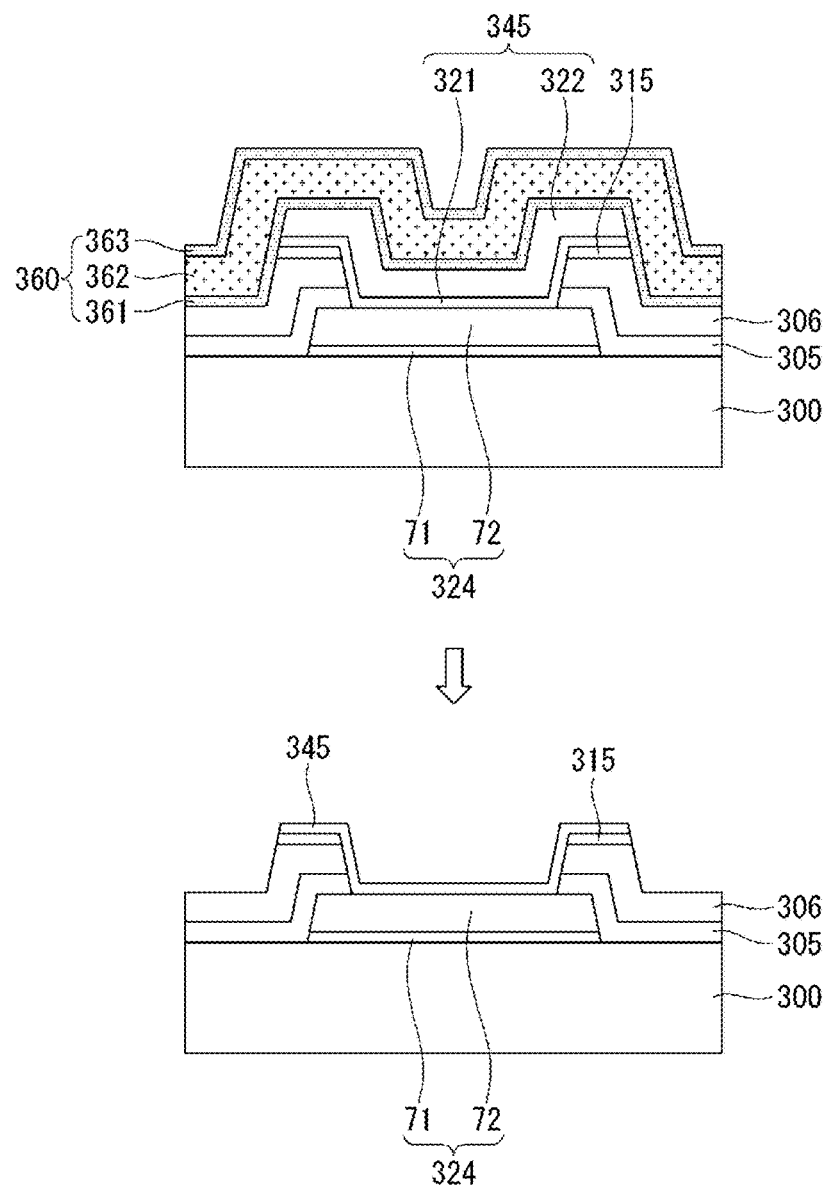
FIG. 20 is a cross-sectional view showing a pad electrode of a pad area through a fabrication process of the organic light emitting display device according to the sixth embodiment of the present disclosure.
Figure 21:
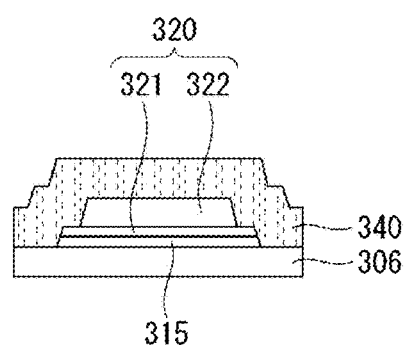
FIG. 21 is a cross-sectional view showing a gate electrode of the organic light emitting display device according to the sixth embodiment of the present disclosure.
Figure 22:
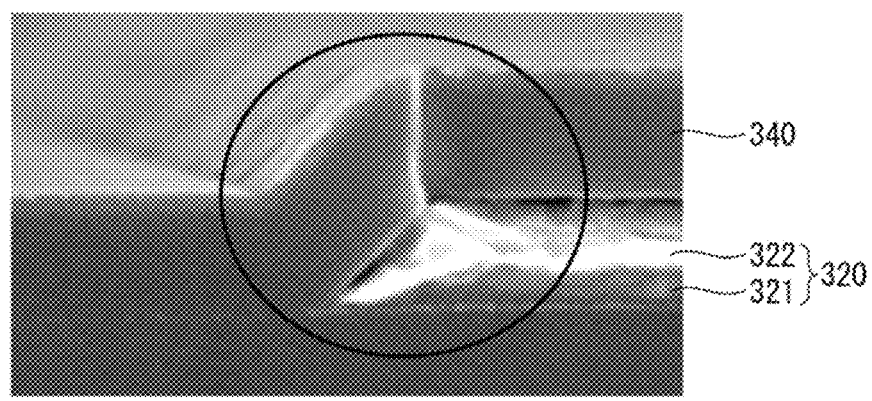
FIG. 22 is a SEM image showing a gate electrode of the organic light emitting display device according to the sixth embodiment of the present disclosure.

FIG. 18 is a cross-sectional view showing an organic light emitting display device according to a sixth embodiment of the present disclosure, FIG. 19 is a flow chart showing a fabrication process of the organic light emitting display device according to the sixth embodiment of the present disclosure, FIG. 20 is a cross-sectional view showing a pad electrode of a pad area through a fabrication process of the organic light emitting display device according to the sixth embodiment of the present disclosure, FIG. 21 is a cross-sectional view showing a gate electrode of the organic light emitting display device according to the sixth embodiment of the present disclosure, and FIG. 22 is a SEM image showing the gate electrode of the organic light emitting display device according to the sixth embodiment of the present disclosure.

In FIG. 18, the organic light emitting display (OLED) device 3000 according to the sixth embodiment of the present disclosure includes a substrate 300 having a sub-pixel area PIX and a pad area PAD. A light shielding layer 308 and a first capacitor electrode 312 are disposed on the substrate 300 in the sub-pixel area PIX, and a lower pad electrode 324 is disposed on the substrate 300 in the pad area PAD. The lower pad electrode 324, the first capacitor electrode 312 and the light shielding layer 308 are formed through the same fabrication process to have the same material and the same lamination structure as each other.

The lower pad electrode 324, the first capacitor electrode 312 and the light shielding layer 308 can have a double layer including a first metal layer 71 and a second metal layer 72. The first metal layer 71 and the second metal layer 72 can include one or an alloy of ones selected from a group of molybdenum (Mo), aluminum (Al), chromium (Cr), gold (Au), titanium (Ti), nickel (Ni), neodymium (Nd) and copper (Cu). In the sixth embodiment, the first metal layer 71 can include molybdenum-titanium (MoTi) and the second metal layer 72 can include copper (Cu). The first metal layer 72 of molybdenum-titanium (MoTi) blocks a light, and the second metal layer 72 of copper (Cu) reduces a resistance.

A first buffer layer 305 and a second buffer layer 306 are disposed on the substrate 300 having the lower pad electrode 324, the first capacitor electrode 312 and the light shielding layer 308. The first buffer layer 305 and the second buffer layer 306 protect a transistor formed in a subsequent fabrication process from an impurity such as an alkali ion released from the substrate 300 and electrically insulate the lower pad electrode 324, the first capacitor electrode 312 and the light shielding layer 308.

A semiconductor layer 310 and a second capacitor electrode 311 spaced apart from each other are disposed on the second buffer layer 306. The semiconductor layer 310 and the second capacitor electrode 311 are formed through the same fabrication process to have the same material and the same lamination structure as each other. In the sixth embodiment, the semiconductor layer 310 and the second capacitor electrode 311 are formed of an oxide semiconductor material, and the oxide semiconductor material of the second capacitor electrode 311 becomes a conductor through a conducting process such that the second capacitor electrode functions as an electrode for a capacitor.

A gate insulating layer 315 is disposed on the semiconductor layer 310 and the second capacitor electrode 311. The gate insulating layer 315 is patterned to have an island shape and is not disposed on a whole of the substrate 300. The gate insulating layer 315 is disposed as a pattern under an upper pad electrode 345, a source electrode 330, a drain electrode 335, a gate electrode 320 and a third capacitor electrode 336 formed in a subsequent process.

The source electrode 330, the drain electrode 335, a gate electrode 320 and the third capacitor electrode 336 are disposed on the gate insulating layer 315 in the sub-pixel area PIX, and the upper pad electrode 345 is disposed on the gate insulating layer 315 in the pad area PAD. The gate electrode 320 is disposed on the gate insulating layer 315 corresponding to a channel region of the semiconductor layer 310. The source electrode 330 and the drain electrode 335 cover the gate insulating layer 315 to contact a surface of the semiconductor layer 310. The source electrode 330 is connected to the light shielding layer 308 through a first contact hole 327 in the first buffer layer 305, the second buffer layer 306 and the gate insulating layer 315. The third capacitor electrode 336 is disposed on the gate insulating layer 315 to overlap the second capacitor electrode 311. The upper pad electrode 345 is connected to the lower pad electrode 324 through a pad hole 338 in the first buffer layer 305, the second buffer layer 306 and the gate insulating layer 315.

The source electrode 330, the drain electrode 335, the gate electrode 320 and the third capacitor electrode 336 can have a double layer of a first gate layer 321 and a second gate layer 322. The first gate layer 321 and the second gate layer 322 can include one or an alloy of ones selected from a group of molybdenum (Mo), aluminum (Al), chromium (Cr), gold (Au), titanium (Ti), nickel (Ni), neodymium (Nd) and copper (Cu). The upper pad electrode 345 can include the same material and the same layer as the first gate layer 321. The source electrode 330, the drain electrode 335, the gate electrode 320 and the semiconductor layer 310 constitute a thin film transistor (TFT) such as a driving transistor.

A material for the first gate layer 321 can have an etch rate smaller than a material for the second gate layer 322. When the etch rate of the second gate layer 322 is smaller than the etch rate of the first gate layer 321, an end portion of the second gate layer 322 can protrude from an end portion of the first gate layer 321, and a step coverage of the passivation layer 340 formed in a subsequent fabrication process can be reduced. In the sixth embodiment, since the etch rate of the first gate layer 321 is smaller than the etch rate of the second gate layer 322, reliability of an element is improved.

A passivation layer 340 is disposed in the sub-pixel area PIX on the substrate 300 having the source electrode 330, the drain electrode 335, the gate electrode 320 and the third capacitor electrode 336. The passivation layer 340 has a first via hole 342 exposing the source electrode 330. An overcoat layer 350 is disposed on the passivation layer 340 in the sub-pixel area PIX. The overcoat layer 350 has a second via hole 352 exposing the first via hole 342 of the passivation layer 340 and the source electrode 330.

A light emitting diode 60 is disposed on the overcoat layer 350. The light emitting diode 60 includes a first electrode 360 connected to the source electrode 330 of the thin film transistor, a second electrode 380 facing the first electrode 360 and an organic emitting layer 375 between the first electrode 360 and the second electrode 380. The first electrode 360 can be an anode, and the second electrode 380 can be a cathode.

The first electrode 360 can be disposed on the overcoat layer 350 and can be connected to the source electrode 330 through the second via hole 352 of the overcoat layer 350 and the first via hole 342 of the passivation layer 340. The first electrode 360 can include a triple layer of indium-zinc-oxide/silver/indium-tin-oxide (IZO/Ag/ITO) in the sixth embodiment. The first electrode 360 can include a lower layer 361 of indium-tin-oxide (ITO), a middle layer 362 of silver (Ag) and an upper layer 363 of indium-zinc-oxide (IZO).

A bank 370 is disposed on the substrate 300 having the first electrode 360. The bank 370 includes a first bank layer 372 and a second bank layer 376. The first bank layer 372 has a first open portion 373 exposing the first electrode 360, and the second bank layer 376 has a second open portion 377 exposing a portion of the first bank layer 372 and the first electrode 360. The second open portion 377 can have an area greater than that of the first open portion 373 to expose the portion of the first bank layer 372.

The organic emitting layer 375 is disposed on the substrate 300 having the bank 370 in the sub-pixel area PIX.

The organic emitting layer 375 can be formed through a soluble fabrication process such as an inkjet printing or a nozzle coating including coating and drying steps to have a top surface of a round shape where the organic emitting layer 375 and the bank 370 contact each other. The organic emitting layer 375 can include red, green and blue emitting materials in the corresponding sub-pixel, and can emit red, green, blue and white colored lights. Alternatively, the whole sub-pixel can emit a white colored light. The second electrode 380 is disposed on the organic emitting layer 375.

A counter substrate 390 is disposed to face the substrate 300 having the light emitting diode 60. The counter substrate 390 seals the substrate 300 and includes a color filter layer 395. The color filter layer 395 can include a red color filter to reinforce a color coordinate of a red color.

The organic light emitting display device according to the sixth embodiment of the present disclosure can be fabricated through a fabrication process using seven photomasks.

In FIGS. 18 and 19, the light shielding layer 308, the first capacitor electrode 312 and the lower pad electrode 324 are formed on the substrate 300 through a first mask process #1. Next, the first buffer layer 305 and the second buffer layer 306 are sequentially formed on the light shielding layer 318, the first capacitor electrode 312 and the lower pad electrode 324. The semiconductor layer 310 and the second capacitor electrode 311 are formed on the second buffer layer 306 through a second mask process #2. Next, the gate insulating layer 315 is formed on the substrate 300 having the semiconductor layer 310 and the second capacitor electrode 311. Openings exposing a portion of the semiconductor layer 310, for example, a source region and a drain region, and the other portions of the substrate 300 are formed in the gate insulating layer 315 by patterning the gate insulating layer 315 through a third mask process #3. During the patterning step of the gate insulating layer 315, the portion of the semiconductor layer 310 exposed through the openings of the gate insulating layer 315 firstly becomes a conductor due to an etching gas (impurity). In addition, the first contact hole 327 and the pad hole 338 are formed in the first buffer layer 305, the second buffer layer 306 and the gate insulating layer 315 by etching the gate insulating layer 315, the second buffer layer 306 and first buffer layer 305 through the third mask process #3.

The gate electrode 320, the source electrode 330, the drain electrode 335, the third capacitor electrode 336 and the upper pad electrode 345 are formed on the substrate 300 having the gate insulating layer 315 through a fourth mask process #4. During the etching step of the gate electrode 320, the source electrode 330, the drain electrode 335, the third capacitor electrode 336 and the upper pad electrode 345, the end portion of the gate insulating layer 315 protruding from the end portion of the gate electrode 320, the third capacitor electrode 336 and the upper pad electrode 345 is simultaneously etched. As a result, the gate insulating layer 315 overlaps the gate electrode 320, the third capacitor electrode 336 and the upper pad electrode 345 such that the end portion of the gate insulating layer 315 coincides with the end portion of the gate electrode 320, the third capacitor electrode 336 and the upper pad electrode 345. The third capacitor electrode 336 becomes a conductor due to the etching gas (impurity), and the exposed portion of the semiconductor layer 310 secondly becomes a conductor. The source electrode 330 and the drain electrode 335 are patterned to have a size greater than that of the gate insulating layer 315 and contact the exposed portion of the semiconductor layer 310.

Next, the passivation layer 340 is formed in the sub-pixel area PIX on the substrate 200 having the gate electrode 320, the source electrode 330, the drain electrode 335 and the third capacitor electrode 336, and the overcoat layer 350 is coated on the substrate 300 having the passivation layer 340. The first via hole 342 is formed in the passivation layer 340 and the second via hole 352 is formed in the overcoat layer 350 through a fifth mask process #5.

The first electrode 360 is formed on the overcoat layer 350 through a sixth mask process #6. In FIG. 20, the lower layer 361 of indium-tin-oxide (ITO), the middle layer 362 of silver (Ag) and the upper layer 363 of indium-zinc-oxide (IZO) are sequentially formed on the upper pad electrode 345 in the pad area PAD. When a silver etchant is used for patterning the first electrode 360, the lower layer 361 of indium-tin-oxide (ITO), the middle layer 362 of silver (Ag) and the upper layer 363 of indium-zinc-oxide (IZO) are etched to be removed, and the second gate layer 322 of the upper pad electrode 345 is also etched to be removed. However, the first gate layer 321 of molybdenum-titanium (MoTi) of the upper pad electrode 345 is not etched by the silver etchant.

The silver etchant can include nitric acid series or phosphoric acid series. A mechanism of the silver etchant of nitric acid series and a mechanism of the silver etchant of phosphoric acid series are expressed as follows.

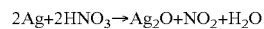

$$2Ag + 2HNO_3 \rightarrow Ag_2O + NO_2 + H_2O$$

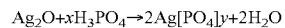

$$Ag_2O + xH_3PO_4 \rightarrow 2Ag[PO_4]y + 2H_2O$$

Although a component of $H_2O_2$ or F is required to the etchant for etching molybdenum-titanium (MoTi), the silver etchant does not include the component of $H_2O_2$ or F as shown in the above mechanism of the silver etchant. In the sixth embodiment, since the upper pad electrode 345 of molybdenum-titanium (MoTi) is formed to protect the lower pad electrode 324 from the silver etchant, influence on the pad area by the etchant is prevented.

The bank 370 is formed on the substrate 300 having the first electrode 360, and the first open portion 373 and the second open portion 377 are formed in the bank 270 through a seventh mask process #7. The organic emitting layer 375 is formed in the first open portion 373 and the second open portion 377 through a soluble fabrication process, and the second electrode 380 is formed on the substrate 300 having the organic emitting layer 375. As a result, the organic light emitting display device is completed through a fabrication process using seven photomasks.

In the organic light emitting display device according to the sixth embodiment of the present disclosure, since the upper pad electrode which is not affected from the silver etchant is formed for protecting the lower pad electrode in the pad area, deterioration of the lower pad electrode in the etching step of the first electrode is prevented. In addition, since the organic light emitting display device according to the sixth embodiment of the present disclosure is fabricated through a fabrication process using seven photomasks, the fabrication cost is reduced and the fabrication process is simplified by reducing the number of the photomasks.

In FIG. 21, since the first gate layer 321 of the gate electrode 320 has an etch rate smaller than that of the second gate layer 322 of the gate electrode 320, the step coverage of the passivation layer 340 on the gate electrode 320 is improved. In FIG. 22, the passivation layer 340 has the step coverage such that the side surface of the gate electrode 320 has a taper shape. As a result, reliability of elements is improved.

In another embodiment, the gate electrode, the source electrode, the drain electrode and the third capacitor electrode can have a triple layer.

Figure 23:
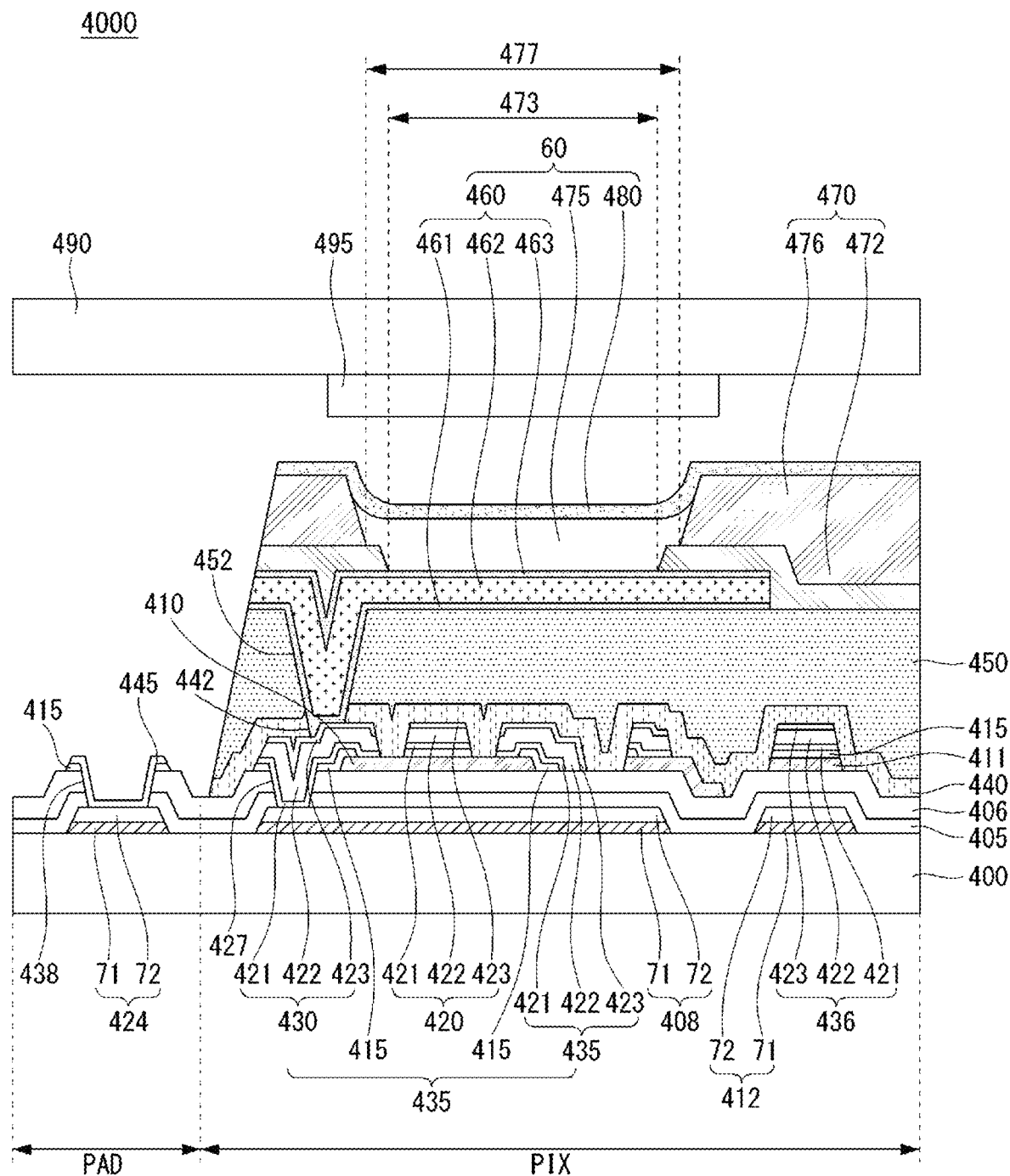
FIG. 23 is a cross-sectional view showing an organic light emitting display device according to a seventh embodiment of the present disclosure.
Figure 24:
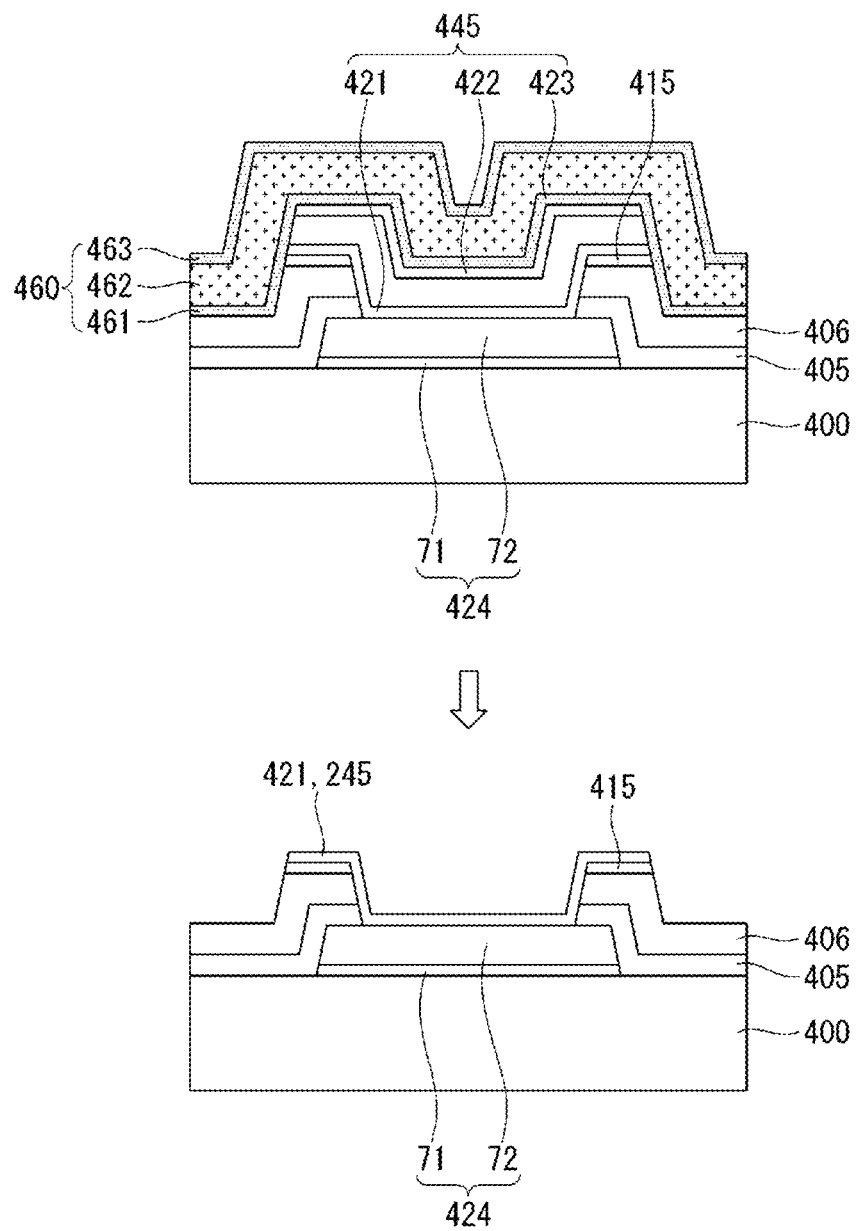
FIG. 24 is a cross-sectional view showing a pad electrode of a pad area through a fabrication process of the organic light emitting display device according to the seventh embodiment of the present disclosure.

FIG. 23 is a cross-sectional view showing an organic light emitting display device according to a seventh embodiment of the present disclosure, and FIG. 24 is a cross-sectional view showing a pad electrode of a pad area through a fabrication process of the organic light emitting display device according to the seventh embodiment of the present disclosure. A part of the seventh embodiment the same as a part of the sixth embodiment can be designated by the same reference number.

In FIG. 23, the organic light emitting display (OLED) device 4000 according to the seventh embodiment of the present disclosure includes a substrate 400 having a sub-pixel area PIX and a pad area PAD. A light shielding layer 408 and a first capacitor electrode 412 are disposed on the substrate 400 in the sub-pixel area PIX, and a lower pad electrode 424 is disposed on the substrate 400 in the pad area PAD. The lower pad electrode 424, the first capacitor electrode 412 and the light shielding layer 408 are formed through the same fabrication process to have the same material and the same lamination structure as each other.

The lower pad electrode 424, the first capacitor electrode 412 and the light shielding layer 408 can have a double layer including a first metal layer 71 and a second metal layer 72.

A first buffer layer 405 and a second buffer layer 406 are disposed on the substrate 400 having the lower pad electrode 424, the first capacitor electrode 412 and the light shielding layer 408. A semiconductor layer 410 and a second capacitor electrode 411 spaced apart from each other are disposed on the second buffer layer 406. The semiconductor layer 410 and the second capacitor electrode 411 are formed through the same fabrication process to have the same material and the same lamination structure as each other. A gate insulating layer 415 is disposed on the semiconductor layer 410 and the second capacitor electrode 411. The gate insulating layer 415 is patterned to have an island shape and is not disposed on a whole of the substrate 400. The gate insulating layer 415 is disposed as a pattern under an upper pad electrode 445, a source electrode 430, a drain electrode 435, a gate electrode 420 and a third capacitor electrode 436 formed in a subsequent process.

The source electrode 430, the drain electrode 435, the gate electrode 420 and the third capacitor electrode 436 are disposed on the gate insulating layer 415 in the sub-pixel area PIX, and the upper pad electrode 445 is disposed on the gate insulating layer 415 in the pad area PAD. The gate electrode 420 is disposed on the gate insulating layer 415 corresponding to a channel region of the semiconductor layer 410. The source electrode 430 and the drain electrode 435 cover the gate insulating layer 415 to contact a surface of the semiconductor layer 410. The source electrode 430 is connected to the light shielding layer 408 through a first contact hole 427 in the first buffer layer 405, the second buffer layer 406 and the gate insulating layer 415. The third capacitor electrode 436 is disposed on the gate insulating layer 415 to overlap the second capacitor electrode 411. The upper pad electrode 445 is connected to the lower pad electrode 424 through a pad hole 438 in the first buffer layer 405, the second buffer layer 406 and the gate insulating layer 415.

The source electrode 430, the drain electrode 435, the gate electrode 420 and the third capacitor electrode 436 can have a triple layer of a first gate layer 421, a second gate layer 422 and a third gate layer 423. The first gate layer 421, the second gate layer 422 and the third gate layer 423 can include one or an alloy of ones selected from a group of molybdenum (Mo), aluminum (Al), chromium (Cr), gold (Au), titanium (Ti), nickel (Ni), neodymium (Nd) and copper (Cu). For example, the first gate layer 421 can include molybdenum-titanium (MoTi), the second gate layer 422 can include copper (Cu), and the third gate layer 423 can include molybdenum-titanium (MoTi) in the seventh embodiment. The upper pad electrode 445 can include the same material and the same layer as the first gate layer 421. The source electrode 430, the drain electrode 435, the gate electrode 420 and the semiconductor layer 410 constitute a thin film transistor (TFT) such as a driving transistor.

A passivation layer 440 is disposed in the sub-pixel area PIX on the substrate 400 having the source electrode 430, the drain electrode 435, the gate electrode 420 and the third capacitor electrode 436. The passivation layer 440 has a first via hole 442 exposing the source electrode 430. An overcoat layer 450 is disposed on the passivation layer 440 in the sub-pixel area PIX. The overcoat layer 450 has a second via hole 452 exposing the first via hole 442 of the passivation layer 440 and the source electrode 430.

A light emitting diode 60 is disposed on the overcoat layer 450. The light emitting diode 60 includes a first electrode 460 connected to the source electrode 430 of the thin film transistor, a second electrode 480 facing the first electrode 460 and an organic emitting layer 475 between the first electrode 460 and the second electrode 480. The first electrode 460 can be an anode, and the second electrode 480 can be a cathode.

The first electrode 460 can be disposed on the overcoat layer 450 and can be connected to the source electrode 430 through the second via hole 452 of the overcoat layer 450 and the first via hole 442 of the passivation layer 440. The first electrode 460 can include a triple layer of indium-zinc-oxide/silver/indium-tin-oxide (IZO/Ag/ITO) in the seventh embodiment. The first electrode 460 can include a lower layer 461 of indium-tin-oxide (ITO), a middle layer 462 of silver (Ag) and an upper layer 463 of indium-zinc-oxide (IZO).

A bank 470 is disposed on the substrate 400 having the first electrode 460. The bank 470 includes a first bank layer 472 and a second bank layer 476. The first bank layer 472 has a first open portion 473 exposing the first electrode 460, and the second bank layer 476 has a second open portion 477 exposing a portion of the first bank layer 472 and the first electrode 460. The organic emitting layer 475 is disposed on the substrate 400 having the bank 470 in the sub-pixel area PIX, and the second electrode 480 is disposed on the organic emitting layer 475.

A counter substrate 490 is disposed to face the substrate 400 having the light emitting diode 60. The counter substrate 490 seals the substrate 400 and includes a color filter layer 495. The color filter layer 495 can include a red color filter to reinforce a color coordinate of a red color.

The organic light emitting display device according to the seventh embodiment of the present disclosure can be fabricated through a fabrication process using seven photomasks as in the sixth embodiment. The sixth mask process will be illustrated hereinafter.

In FIGS. 23 and 24, the first electrode 460 is formed on the overcoat layer 450 through a sixth mask process #6.

The upper pad electrode 445 includes the first gate layer 421, the second gate layer 422 and the third gate layer 423. The lower layer 461 of indium-tin-oxide (ITO), the middle layer 462 of silver (Ag) and the upper layer 463 of indium-zinc-oxide (IZO) are sequentially formed on the upper pad electrode 445 in the pad area PAD. When a silver etchant is used for patterning the first electrode 460, the lower layer 461 of indium-tin-oxide (ITO), the middle layer 462 of silver (Ag) and the upper layer 463 of indium-zinc-oxide (IZO) are etched to be removed, and the second gate layer 422 and the third gate layer 423 of the upper pad electrode 445 are also etched to be removed. As a result, the pad area of the organic light emitting display device according to the seventh embodiment of the present disclosure has the same structure as the pad area of the organic light emitting display device according to the sixth embodiment of the present disclosure.

In the organic light emitting display device according to the seventh embodiment of the present disclosure, since the upper pad electrode which is not affected from the silver etchant is formed for protecting the lower pad electrode in the pad area, deterioration of the lower pad electrode in the etching step of the first electrode is prevented. In addition, since the organic light emitting display device according to the seventh embodiment of the present disclosure is fabricated through a fabrication process using seven photomasks, the fabrication cost is reduced and the fabrication process is simplified by reducing the number of the photomasks.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light emitting display device, comprising:
   a substrate having a sub-pixel area and a pad area;
   a light shielding layer on the substrate in the sub-pixel area;
   a thin film transistor on the light shielding layer in the sub-pixel area;
   a light emitting diode in the sub-pixel area and connected to the thin film transistor;
   a lower pad electrode in the pad area;
   a first insulating layer covering the lower pad electrode to expose a portion of the lower pad electrode;
   an upper pad electrode on the first insulating layer and connected to the lower pad electrode; and
   a second insulating layer between the first insulating layer and the upper pad electrode, the second insulating layer overlapping the upper pad electrode so that an end portion of the second insulating layer coincides with an end portion of the upper pad electrode.

2. The organic light emitting display device of claim 1, wherein the lower pad electrode has a same lamination structure as the light shielding layer.

3. The organic light emitting display device of claim 2, wherein the lower pad electrode and the light shielding layer include a first metal layer and a second metal layer on the first metal layer.

4. The organic light emitting display device of claim 3, wherein each of the first metal layer and the second metal layer includes one or an alloy of ones selected from a group of molybdenum (Mo), aluminum (Al), chromium (Cr), gold (Au), titanium (Ti), nickel (Ni), neodymium (Nd) and copper (Cu).

5. The organic light emitting display device of claim 4, wherein the first metal layer includes molybdenum-titanium (MoTi), and the second metal layer includes copper (Cu).

6. The organic light emitting display device of claim 1, wherein the first insulating layer includes at least one buffer layer, and the second insulating layer includes a gate insulating layer.

7. The organic light emitting display device of claim 1, wherein the thin film transistor includes a semiconductor layer, a gate electrode, a source electrode and a drain electrode.

8. The organic light emitting display device of claim 7, wherein each of the gate electrode, the source electrode and the drain electrode has one of a double layer including a first gate layer and a second gate layer and a triple layer including a first gate layer, a second gate layer and a third gate layer.

9. The organic light emitting display device of claim 8, wherein each of the first gate layer, the second gate layer and the third gate layer includes one or an alloy of ones selected from a group of molybdenum (Mo), aluminum (Al), chromium (Cr), gold (Au), titanium (Ti), nickel (Ni), neodymium (Nd) and copper (Cu).

10. The organic light emitting display device of claim 9, wherein the upper pad electrode has a same material as the first gate layer.

11. The organic light emitting display device of claim 10, wherein the upper pad electrode and the first gate layer include molybdenum-titanium (MoTi).

12. The organic light emitting display device of claim 7, wherein the source electrode and the drain electrode are disposed on and contact the second insulating layer.

13. The organic light emitting display device of claim 1, wherein the light emitting diode includes a first electrode, an organic emitting layer and a second electrode in the sub-pixel area.

14. The organic light emitting display device of claim 13, further comprising:
   a first bank layer exposing the first electrode; and
   a second bank layer on the first bank layer and exposing the first bank layer and the first electrode.

15. The organic light emitting display device of claim 14, wherein the first bank layer has a hydrophilicity and the second bank layer has a hydrophobicity.

16. The organic light emitting display device of claim 14, wherein the first bank layer has a first open portion for exposing the first electrode, the second bank layer has a second open portion for exposing the first bank layer and the first electrode, and the second open portions are arranged to be parallel to each other along a first direction and extend along a second direction, to expose the first electrodes and the first open portions along the second direction.

17. The organic light emitting display device of claim 16, wherein an emitting material of the light emitting diodes emitting a same colored light are dispensed in a single second open portions.

18. The organic light emitting display device of claim 1, wherein the first insulating layer covers the light shielding layer to expose a portion of the light shielding layer.

19. The organic light emitting display device of claim 7, wherein the end portion of the second insulating layer coincides with the end portion of the gate electrode.

20. The organic light emitting display device of claim 7, wherein a material for the first gate layer has an etch rate smaller than a material for the second gate layer.

* * * * *